US011900979B2

(12) United States Patent
Li et al.

(10) Patent No.: US 11,900,979 B2
(45) Date of Patent: Feb. 13, 2024

(54) PROBABILISTIC IN-MEMORY COMPUTING

(71) Applicant: INTEL CORPORATION, Santa Clara, CA (US)

(72) Inventors: Hai Li, Portland, OR (US); Dmitri E. Nikonov, Beaverton, OR (US); Punyashloka Debashis, Hillsboro, OR (US); Ian A. Young, Olympia, WA (US); Mahesh Subedar, Laveen, AZ (US); Omesh Tickoo, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 37 days.

(21) Appl. No.: 17/508,818

(22) Filed: Oct. 22, 2021

(65) Prior Publication Data
US 2022/0044719 A1    Feb. 10, 2022

(51) Int. Cl.
*G11C 11/16*    (2006.01)
*G06F 7/544*    (2006.01)
(Continued)

(52) U.S. Cl.
CPC ........ *G11C 11/1673* (2013.01); *G06F 7/5443* (2013.01); *G06N 3/045* (2023.01);
(Continued)

(58) Field of Classification Search
CPC ............ G11C 11/1673; G11C 11/1675; G11C 11/1697; G11C 11/54; G11C 11/1659;
(Continued)

(56) References Cited

U.S. PATENT DOCUMENTS 10,248,907 B2 *   4/2019   Gokmen ............... G06N 3/047
11,222,259 B2 *   1/2022   Koswatta ............. G06N 3/084
(Continued)

FOREIGN PATENT DOCUMENTS

WO    WO2020/150419 A1    7/2020

OTHER PUBLICATIONS

Charles Blundell et al., "Weight Uncertainty in Neural Network", Proceedings of the 32nd International Conference on Machine Learning (PMLR), vol. 37, pp. 1613-1622 (2015), available at: https://proceedings.mlr.press/v37/blundell15.html.
(Continued)

*Primary Examiner* — Ajay Ojha
(74) *Attorney, Agent, or Firm* — Jordan IP Law, LLC

(57) ABSTRACT

Embodiments of the present disclosure are directed toward probabilistic in-memory computing configurations and arrangements, and configurations of probabilistic bit devices (p-bits) for probabilistic in-memory computing. concept with emerging. A probabilistic in-memory computing device includes an array of p-bits, where each p-bit is disposed at or near horizontal and vertical wires. Each p-bit is a time-varying resistor that has a time-varying resistance, which follows a desired probability distribution. The time-varying resistance of each p-bit represents a weight in a weight matrix of a stochastic neural network. During operation, an input voltage is applied to the horizontal wires to control the current through each p-bit. The currents are accumulated in the vertical wires thereby performing respective multiply-and-accumulative (MAC) operations. Other embodiments may be described and/or claimed.

26 Claims, 9 Drawing Sheets

(51) Int. Cl.
*G11C 11/54* (2006.01)
*G06N 3/045* (2023.01)
*G06N 3/047* (2023.01)

(52) U.S. Cl.
CPC .......... *G06N 3/047* (2023.01); *G11C 11/1675* (2013.01); *G11C 11/1697* (2013.01); *G11C 11/54* (2013.01)

(58) Field of Classification Search
CPC ... G11C 11/18; G11C 11/223; G11C 11/2259; G11C 11/2273; G11C 11/2275; G11C 11/5607; G11C 11/5657; G06F 7/5443; G06N 3/045; G06N 3/047; G06N 3/065; G06N 3/084; G06N 7/01
See application file for complete search history.

(56) References Cited

U.S. PATENT DOCUMENTS

| | | | | |
|---|---|---|---|---|
| 2022/0180156 | A1* | 6/2022 | Gong | G11C 11/2273 |
| 2022/0309329 | A1* | 9/2022 | Amiri | G06N 3/048 |
| 2022/0350572 | A1* | 11/2022 | Fukami | H01L 29/82 |
| 2023/0075348 | A1* | 3/2023 | Lee | H03K 19/21 |

OTHER PUBLICATIONS

Kerem Y. Camsari et al., "p-Bits for Probabilistic Spin Logic", Applied Physics Reviews, vol. 6, issue 1, 011305 (Published Online: Mar. 11, 2019), 11 pages; https://doi.org/10.1063/1.5055860.

Shan Deng et al., "A Comprehensive Model for Ferroelectric FET Capturing the Key Behaviors: Scalability, Variation, Stochasticity, and Accumulation," 2020 IEEE Symposium on VLSI Technology, pp. 1-2 (Jun. 16, 2020).

Halimah Harfah et al., "High magnetoresistance of hexagonal boron nitride-graphene heterostructure-based MTJ through excited-electron transmission", Nanoscale Advances, issue 1, pp. 117-124 (Jan. 7, 2022; Published Online: Oct. 21, 2021), 7 pages, available at: https://pubs.rsc.org/en/content/articlelanding/2022/na/d1na00272d.

Yu-Ming Hung et al., "Spin transport in antiferromagnetic NiO and magnetoresistance in Y3Fe5O12/NiO/Pt structures", AIP Advances, vol. 7, issue 5, 055903 (Dec. 22, 2016), 6 pages; https://doi.org/10.1063/1.4972998.

Qiming Shao et al., "Roadmap of Spin-Orbit Torques", arXiv:2104.11459v2 (May 6, 2021), 68 pages, available at: https://arxiv.org/ftp/arxiv/papers/2104/2104.11459.pdf.

Hao Wang et al., "A Survey on Bayesian Deep Learning", ACM Computing Surveys, vol. 53, issue 5, Article 108, pp. 1-37 (Sep. 2021), 37 pages, available at: https://doi.org/10.1145/3409383.

Guoqiang Yu et al., "Strain-induced modulation of perpendicular magnetic anisotropy in Ta/CoFeB/MgO structures investigated by ferromagnetic resonance", Applied Physics Letters 106, 072402 (2015), 6 pages; doi: 10.1063/1.4907677.

Yongqian Zhou et al., "Current-Induced In-Plane Magnetization Switching in a Biaxial Ferrimagnetic Insulator", Phys. Rev. Applied, vol. 13, No. 6, 064051 (Jun. 22, 2020), 23 pages.

Jodi M. Iwata-Harms et al., "Ultrathin perpendicular magnetic anisotropy CoFeB free layers for highly efficient, high speed writing in spin-transfer-torque magnetic random access memory", Scientific Reports, vol. 9, Article No. 19407, 7 pages (Dec. 19, 2019), https://www.nature.com/articles/s41598-019-54466-7.

Laurent Valentin Jospin et al., "Hands-on Bayesian Neural Networks—a Tutorial for Deep Learning Users", arXiv:2007.06823v2 [cs.LG], 24 pages (Sep. 30, 2021), https://arxiv.org/pdf/2007.06823v2.pdf.

Jan Kaiser et al., "Perspective: Probabilistic computing with p-bits", arXiv:2108.09836v1, 8 pages (Aug. 22, 2021), https://arxiv.org/pdf/2108.09836v1.pdf.

Gauthaman Murali et al., "Heterogeneous Mixed-Signal Monolithic 3-D In-Memory Computing Using Resistive RAM", IEEE Transactions on Very Large Scale Integration (VLSI) Systems, vol. 29, No. 2, pp. 386-396 (Feb. 2021).

Christopher Safranski et al., "Demonstration of nanosecond operation in stochastic magnetic tunnel junctions", arXiv:2010.14393v1 [cond-mat.mes-hall], 9 pages (Oct. 27, 2020), https://arxiv.org/pdf/2010.14393.pdf.

Roshnee Sahoo et al., "In-plane and out of plane magnetic properties in Ni46Co4Mn38Sb12 Heusler alloys ribbons", J. Appl. Phys. 113, 17A940 (2013), 12 pages. (published online Apr. 11, 2013), https://arxiv.org/ftp/arxiv/papers/1307/1307.3778.pdf.

Shehrin Sayed et al., "Spin Funneling for Enhanced Spin Injection into Ferromagnets", Scientific Reports, vol. 6, Article No. 28868, 11 pages (Jul. 4, 2016), https://www.nature.com/articles/srep28868.

* cited by examiner

PROBABILISTIC IN-MEMORY COMPUTING

FIELD

Embodiments of the present disclosure generally relate to the field of electronics, and more particularly, to configurations, arrangements, operation, and fabrication of artificial intelligence and/or machine learning (AI/ML) hardware devices.

BACKGROUND

Artificial intelligence (AI) and/or Machine learning (ML) architectures are typically based on artificial neural networks (ANNs). ANNs, such as deep neural networks (DNNs), are currently used in numerous ML applications such as computer vision, speech recognition, robotics, among many others. ANNs are inspired by signal processes in biological neural networks. Biological neural networks are composed of groups of chemically connected or functionally associated neurons. A single neuron may be connected to many other neurons. Neurons are connected to one another through connections referred to as "synapses." A synapse is a structure that permits a neuron to pass an electrical or chemical signal to another neuron. The total number of neurons and connections (synapses) and the density of neurons and synapses in a biological neural network may be quite extensive.

Probabilistic computing devices are computer devices that include probabilistic bits (p-bits) that may process multiple states of zeros and ones at one time, where each p-bit rapidly fluctuates between zero and one. Machine learning (ML) models for probabilistic computing use stochastic weight parameters instead of point estimates. Probabilistic ML models require sampling of weight parameters from probability distributions and fast multiply-and-accumulate (MAC) operations. However, existing probabilistic computing architectures require high data transfer volumes and relatively large amounts of memory/storage resources to implement MAC calculations, which results in relatively high power consumption when generating probabilistic inferences.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
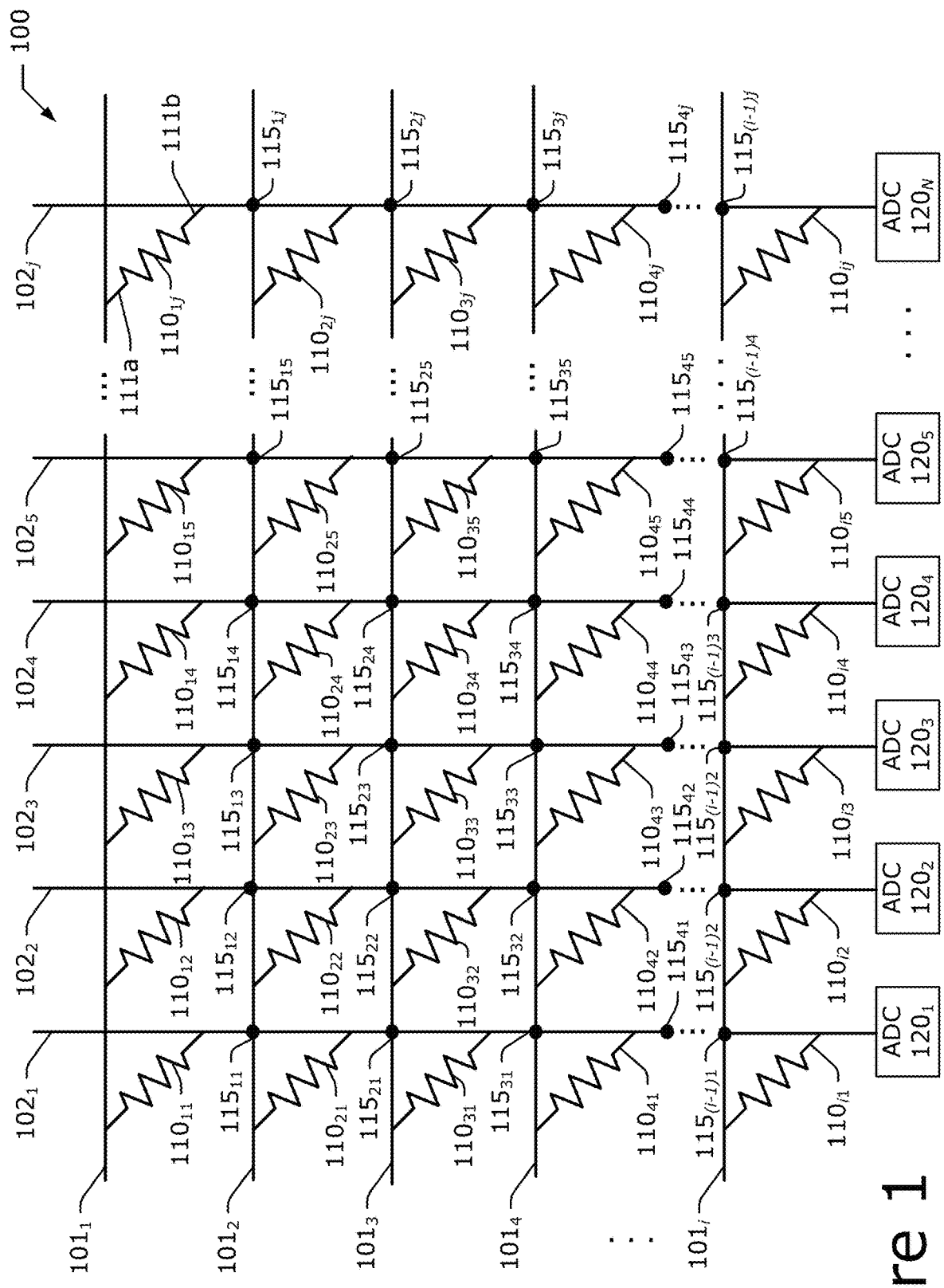
FIG. 1 depicts a two dimensional (2D) array of probabilistic bits (p-bits) with analog-to-digital conversion according to various embodiments.

Embodiments of the present disclosure describes configurations, arrangements, and operations of hardware elements for operating artificial neural networks (ANNs), and in particular, hardware elements and architectures for probabilistic computing.

As mentioned previously, machine learning (ML) models for probabilistic computing use stochastic weight parameters instead of point estimates, and require weight parameter sampling from probability distributions (e.g., Gaussian distributions) as well as fast multiply-and-accumulate (MAC) operations. For example, the output inferences of Bayesian neural networks (BNNs) with posterior probability distributions (e.g. variational inference, Markov chain Monte Carlo (MCMC), etc.) require millions of stochastically sampled weights and fifty times (50×) more compute/memory resources than other deep neural network (DNN) topologies. Therefore, reducing the memory footprint and data transfer volumes while implementing efficient MAC calculations can achieve low-power hardware implementation for probabilistic inferences.

Existing probabilistic computing systems/architectures use digital logic circuits to perform random number generation (RNG) and matrix-vector multiplication (MVM) to perform probabilistic computing, such as operating BNNs. These probabilistic computing systems are mainly realized using digital circuits, where input data vectors are stored in memory arrays and accessed for each computation. The stochastic weight coefficients are generated using an RNG circuit and then multiplied with the input vector. Since the data storage devices and/or memory arrays are some distance away from the computational unit, large volumes of data must be transferred from the memory arrays to the computational unit. These large data transfers produce significant amounts of overhead in terms of energy consumption as well as bandwidth utilization, and thus, data transfer operations tend to dominate latency and power consumption for these systems. Additionally, sampling the weights from different probability distributions requires changes to RNG circuits, which is therefore difficult to implement arbitrary probability distributions. Furthermore, floating-point MAC operations require large silicon area resulting in large power consumption.

The present disclosure provides probabilistic bit (p-bit) based in-memory computation arrangements that combine the efficient stochastic weight generation and efficient MAC operations for a low-power probabilistic computing hardware architecture. In particular, the present disclosure provides in-memory probabilistic compute devices capable of implementing neural networks more efficiently than existing technologies. The in-memory probabilistic compute devices provide random resistance values, where a probability distribution (e.g., a Gaussian distribution) can be controlled. The in-memory probabilistic compute devices are more efficient than existing technologies because the existing technologies use fixed resistors or devices with a fixed resistance, which as explained supra requires more computational resources for performing computations and for data transfers for performing tasks using probability-based neural networks such as BNNs. The embodiments for providing in-memory compute mechanisms for such neural networks are discussed in more detail infra.

1. Probabilistic Computing Arrangements and Configurations

FIG. 1 depicts a probabilistic computing unit 100 according to various embodiments. Here, the concept of in-memory computing is combined with probabilistic computing. The probabilistic computing unit 100 includes input lines 101$_1$ to 101$_i$ where i is a number (collectively referred to as "input lines 101", "input terminals 101", input wires 101", or the like), accumulation lines 102$_1$ to 102$_j$ where j is a number (collectively referred to as "accumulation lines 102", "accumulation wires 102", "vertical lines 102", or the like), multiple probabilistic bit devices (p-bits) 110$_{ij}$ (where the subscript i indicates a corresponding input line 101 to which a p-bit 110 is coupled, and the subscript j indicates a corresponding accumulation line 102 to which a p-bit 110 is coupled (collectively referred to as "p-bits 110" or "p-bit 110"), and analog-to-digital conversion units (ADCs) 120$_1$ to 120$_i$. (collectively referred to as "ADCs 120" or "ADC 120").

The probabilistic computing unit 100 is an array of p-bits 110$_{ij}$, where each p-bit 110 is disposed at or near a crossing point of an input line 101 and an accumulation line 102. In particular, each p-bit 110$_{ij}$ has a first terminal 111a (or connector 111a) connected to a respective portion of an input line 101, and also has a second terminal 111b (or connector 111b) connected to a respective portion of an accumulation line 102 (note that not all terminals 111a and 111b are labeled in FIG. 1 for the sake of clarity). The second terminal 111b of each p-bit 110$_{ij}$ is connected to their respective portion of their accumulation line that precedes an intersection point 115 (or crossing point 115) between the accumulation line 102 and another input line 101 to which another p-bit 110$_{ij}$ is connected. For example, in FIG. 1, the p-bit 110$_{1j}$ has a first terminal 111a connected to input line 101$_1$ and a second terminal 111b connected to accumulation line 102$_j$ at a point preceding the intersection point (node) 115$_{1j}$. Here, node 115$_{1j}$ is an intersection point between accumulation line 102$_j$ and input line 101$_2$ to which p-bit 110$_{2j}$ is connected. The input lines 101 and the accumulation lines 102 may be formed of any suitable conductive and/or interconnect material such as, for example, copper (Cu), tungsten (W), ruthenium (Ru), cobalt (Co), tungsten nitride (WN), titanium nitride (TiN), or a combination thereof. Additionally, the input lines 101 and the accumulation lines 102 may be formed of the same material (or combination of materials), or may be formed of different materials (or combination of materials).

In various embodiments, each p-bit 110$_{ij}$ is a binary stochastic neuron that output a signal representative of a '1' or '0' with a probability that is controllable through an analogue input. In this implementation, each p-bit 110 is a time-varying resistor representing a matrix element of a weight matrix. The resistance of each time-varying resistor is probabilistic with a certain distribution function whose parameters carry information for a weight and/or stochasticity of the model. The probabilistic nature of the p-bits 110 can be utilized to design devices that model certain problems of interest such as, for example, AI/ML tasks, optimization, and/or sampling problems. The structure and materials of the p-bits 110 is discussed infra with respect to FIGS. 5-7.

During operation, elements (values) of a weight matrix (or vector or tensor) are fed into respective input lines 101. For example, a first element of the weight matrix may be fed into the first input line 101$_1$, a second element of the weight matrix may be fed into the second input line 101$_2$, and so forth to an i-th element of the weight matrix is fed into the i-th input line 101$_i$. The voltage of each input element is multiplied by the conductance of corresponding resistors 110 to produce current that flows out of corresponding nodes 115 downward along the vertical lines 102 to an ADC 120. For example, an input voltage applied to input line 101$_1$ is multiplied by the conductance of each resistor 110$_{11}$ to 110$_{1j}$, which causes current to flow through nodes 115$ii$ to 115$_{1j}$, respectively, via the accumulation lines 102$_1$ to 102$_j$. The current is then accumulated with a current that is produced by applying another input voltage to input line 101$_2$ multiplied by the conductance of resistors 110$_{21}$ to 110$_{2j}$, and this accumulated current flows through nodes 11521 to 115$_{2j}$, and so forth until the accumulated current enters a corresponding ADC 120. Each ADC 120 converts the accumulated current from its accumulation line 102 into a digital signal. Given that voltage at the input terminals 101 controls the current through each device, these currents are summed up in the vertical wires 102, and then digitized by the ADCs 120. Mathematically, these operations produce element-wise multiplication of the input vector with the weight vector stored inside the 2D array of p-bits 110.

In this architecture, the weights do not need to be retrieved from a distant memory array or storage device. Each p-bit 110 has a time-varying resistance, which follows a desired probability distribution (e.g., a Gaussian distribution or some other probability distribution). This allows for local RNG instead of using long-distance generation-and-fetching. In probabilistic computing, such as for stochastic NNs (e.g., BNNs, DBNNs, etc.), such MAC operations and stochastic weight generation dominate computing tasks.

Figure 2:
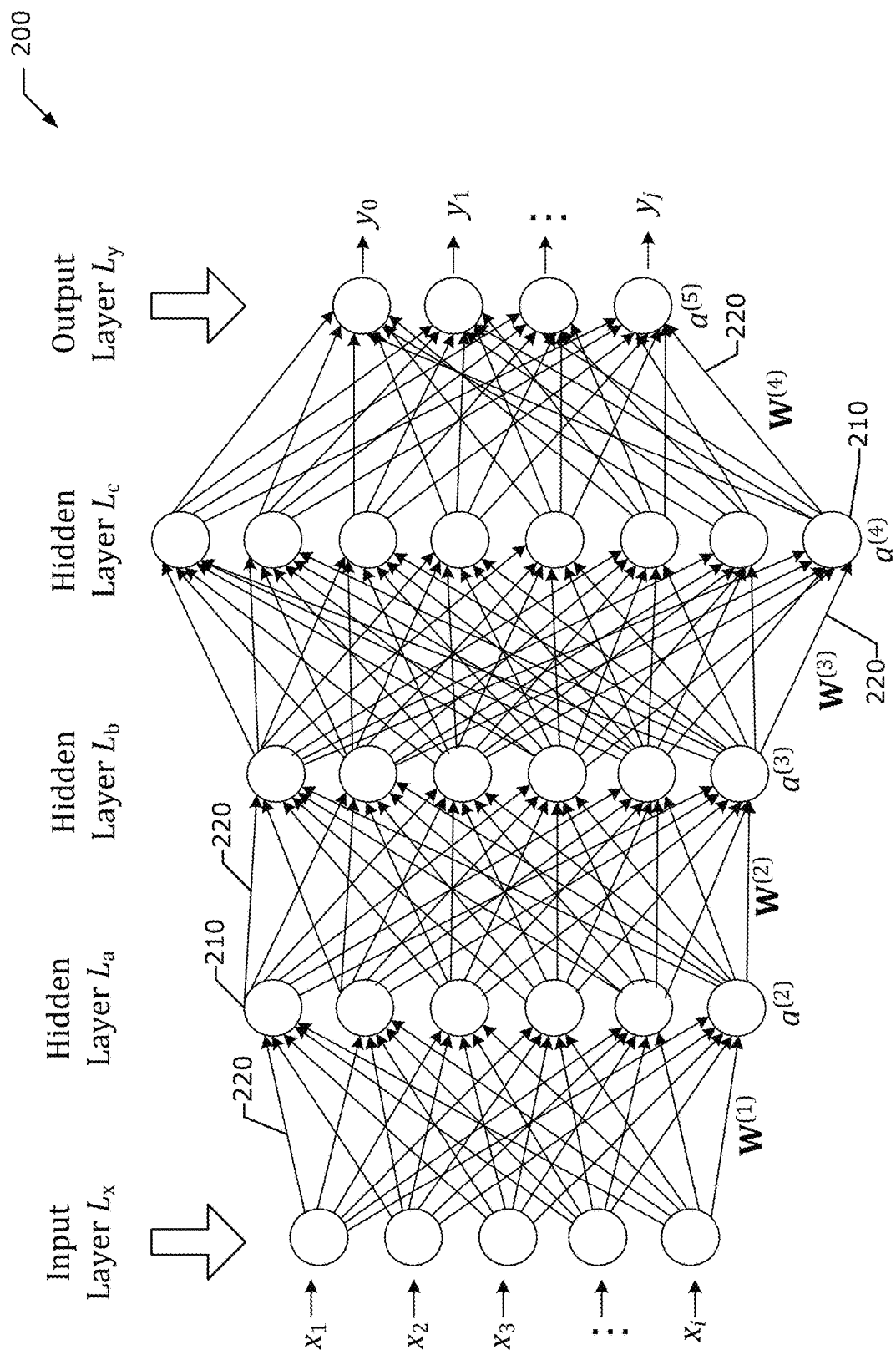
FIG. 2 depicts an example neural network (NN) according to various embodiments.
Figure 3:
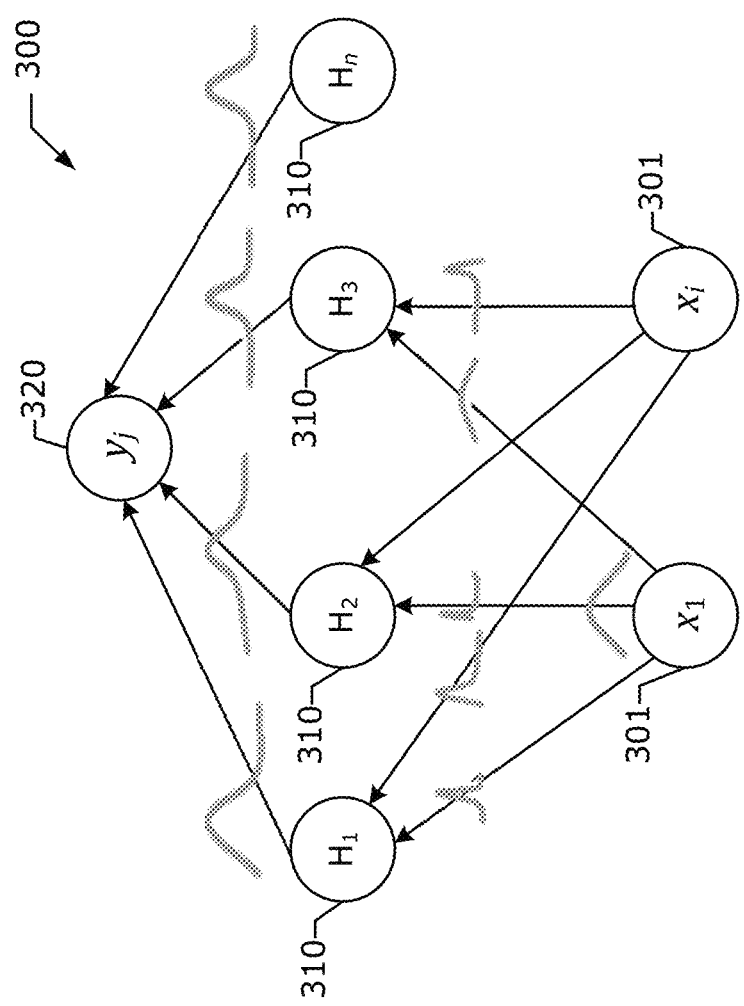
FIG. 3 depicts an example Bayesian NN (BNN) according to various embodiments.

The 2D array of the probabilistic computing unit 100 may represent one processing unit of a probabilistic computing system/device that can store a full or partial layer of a neural network (NN) or multiple layers of an NN (see e.g., FIGS. 2-3). During data propagation, the data of a first layer of an NN can be provided to the probabilistic computing unit 100 for processing, and the generated result is then passed to another probabilistic computing unit 100 of a next layer of the NN, and so on so forth. Once the data propagation crosses all the NN model layers, the computation is complete. Though this process, all the random weight parameters are generated, stored, and operated locally.

In contrast to existing in-memory computing units, which use two-state devices (e.g., transistors), the probabilistic computing unit 100 uses stochastic devices (e.g., p-bits 110). The probabilistic computing unit 100 also allows for data transfers, random number generation, and vector-matrix multiplication (VMM) altogether for probabilistic computing applications such as stochastic NNs (e.g., BNNs, DBNNs, etc.). Since relatively large weight matrices do not have to be transferred to the probabilistic computing unit 100 and a dedicated active noise generator is not required, a relatively large amount power can be saved. Additionally, the likelihood of computing bottlenecks traditionally associated with stochastic NNs (e.g., BNNs, DBNNs, etc.), can be reduced by using the probabilistic computing unit 100.

FIG. 2 illustrates an example NN 200, which may be suitable for use by one or more of the computing systems (or subsystems) of the various implementations discussed herein, implemented in part by a HW accelerator, and/or the like. The NN 200 may be deep neural network (DNN) used as an artificial brain of a compute node or network of compute nodes to handle very large and complicated observation spaces. Additionally or alternatively, the NN 200 can be some other type of topology (or combination of topologies), such as a feed forward NN (FFN), a deep FNN (DFF), recurrent NN (RNN), deep belief NN, stochastic NNs (e.g., Bayesian Network (BN), Bayesian belief network (BBN), a Bayesian NN (BNN), Deep BNN (DBNN), Dynamic BN (DBN), probabilistic graphical model (PGM), Boltzmann machine, restricted Boltzmann machine (RBM), Hopfield network or Hopfield NN, convolutional deep belief network (CDBN), etc.), and/or some other type of ML architecture such as those discussed herein.

The NN 200 may encompass a variety of ML techniques where a collection of connected artificial neurons 210 that (loosely) model neurons in a biological brain that transmit signals to other neurons/nodes 210. The neurons 210 may also be referred to as nodes 210, processing elements (PEs) 210, or the like. The connections 220 (or edges 220) between the nodes 210 are (loosely) modeled on synapses of a biological brain and convey the signals between nodes 210. Note that not all neurons 210 and edges 220 are labeled in FIG. 2 for the sake of clarity.

Each neuron 210 has one or more inputs and produces an output, which can be sent to one or more other neurons 210 (the inputs and outputs may be referred to as "signals"). Inputs to the neurons 210 of the input layer $L_x$ can be feature values of a sample of external data (e.g., input variables $x_i$). The input variables $x_i$ can be set as a vector containing relevant data (e.g., observations, ML features, etc.). The inputs to hidden units 210 of the hidden layers $L_a$, $L_b$, and $L_c$ may be based on the outputs of other neurons 210. The outputs of the final output neurons 210 of the output layer $L_y$ (e.g., output variables $y_j$) include predictions, inferences, and/or accomplish a desired/configured task. The output variables $y_j$ may be in the form of determinations, inferences, predictions, and/or assessments. Additionally or alternatively, the output variables $y_j$ can be set as a vector containing the relevant data (e.g., determinations, inferences, predictions, assessments, and/or the like).

In the context of ML, an "ML feature" (or simply "feature") is an individual measurable property or characteristic of a phenomenon being observed. Features are usually represented using numbers/numerals (e.g., integers), strings, variables, ordinals, real-values, categories, and/or the like. Additionally or alternatively, ML features are individual variables, which may be independent variables, based on observable phenomenon that can be quantified and recorded. ML models use one or more features to make predictions or inferences. In some implementations, new features can be derived from old features.

Neurons 210 may have a threshold such that a signal is sent only if the aggregate signal crosses that threshold. A node 210 may include an activation function, which defines the output of that node 210 given an input or set of inputs. Additionally or alternatively, a node 210 may include a propagation function that computes the input to a neuron 210 from the outputs of its predecessor neurons 210 and their connections 220 as a weighted sum. A bias term can also be added to the result of the propagation function. In some implementations, the NN 200 may be a stochastic NN built by introducing random variations into the NN, either by giving the neurons 210 stochastic transfer functions, or by giving them stochastic weights 220.

The NN 200 also includes connections 220, some of which provide the output of at least one neuron 210 as an input to at least another neuron 210. Each connection 220 may be assigned a weight (also referred to as "weight 220") that represents its relative importance. The weights 220 may be adjusted as learning proceeds. Individual weights 220 increase or decrease the strength of the signal at a connection 220. Some or all of the weights 220 may be matrices of multiple weight values, which are labelled $W^{(1)}$ to $W^{(4)}$ in this example (note that not all weights 220 are labelled with their respective weight matrices). In some implementations, the weights 220 (or weight matrices) may represent one or more probability distributions such as when the NN 200 is a stochastic NNs (e.g., BNNs, DBNNs, etc.) or other like NN architecture/topology that utilizes probability distributions (see e.g., FIG. 3).

The neurons 210 can be aggregated or grouped into one or more layers L where different layers L may perform different transformations on their inputs. In FIG. 2, the NN 200 comprises an input layer $L_x$, one or more hidden layers $L_a$, $L_b$, and $L_c$, and an output layer $L_y$ (where a, b, c, x, and y may be numbers), where each layer L comprises one or more neurons 210. Signals travel from the first layer (e.g., the input layer $L_1$), to the last layer (e.g., the output layer $L_y$), possibly after traversing the hidden layers $L_a$, $L_b$, and $L_c$ multiple times. In FIG. 2, the input layer $L_a$ receives data of input variables $x_i$ (where i=1, . . . , p, where p is a number). Hidden layers $L_a$, $L_b$, and $L_c$ processes the inputs $x_i$, and eventually, output layer $L_y$ provides output variables $y_j$ (where j=1, . . . , p', where p' is a number that is the same or different than p). In the example of FIG. 2, for simplicity of illustration, there are only three hidden layers $L_a$, $L_b$, and $L_c$ in the ANN 200, however, the ANN 200 may include many more (or fewer) hidden layers $L_a$, $L_b$, and $L_c$ than are shown.

FIG. 3 shows an example BNN 300 with three fully connected variational layers, including an input layer with input nodes 301, a hidden layer with hidden nodes 310, and an output layer with an output node 320. In other implementations, many more hidden layers and hidden nodes 310 may be included in the BNN 300. Additionally, other implementations may include an input layer with many more input nodes 301 than are shown by FIG. 3 and/or an output layer with many more output node 320 than are shown by FIG. 3. Here, the parameters 310 (e.g., weights and biases) are represented as probability distributions (e.g., a Gaussian distribution or some other probability distribution) over possible values rather than having a single fixed value. In one example, each weight in BNN 300 is assigned a distribution as provided by Bayes by Backprop, which uses unbiased estimates of gradients of a cost function to learn a distribution over the weights of a neural network (see e.g., Blundell et al., "Weight Uncertainty in Neural Network", Proceedings of the 32nd International Conference on Machine Learning, 37, pp. 1613-1622 (2015), ("[Blundell]"), the contents of which is hereby incorporated by reference in its entirety). The probability distribution will typically have a mean μ and a standard deviation a, and may have other attributes or parameters such as skewness, kurtosis, and/or the like. Additionally, the final output value of the output node 320 will also be a probability distribution. Additional aspects of BNNs, Bayesian deep learning, and DBNNs are discussed in Wang et al., "A Survey on Bayesian Deep Learning", ACM Computing Surveys, vol. 53, No. 5, Article 108, 37 pages (September 2020) ("[Wang]") and Jospin et al., "Hands-on Bayesian Neural Networks—a Tutorial for Deep Learning Users", arXiv:2007.06823v2 [cs.LG] (30 Sep. 2021), the contents of each which are hereby incorporated by reference in their entireties. Because the parameters 310 (e.g., weights and biases) are represented as probability distributions, more computational resources are needed to compute the final output value when the BNN 300 is operated on conventional hardware devices.

In one example implementation, during the training phase, the weight parameters of the probability distribution are learned by stochastic gradient descent optimization. During the inference phase, the weights are sampled from the probability distribution and multiple forward passes (~50 times) are run to obtain a distribution (histogram) at the output 320. The uncertainty estimates obtained from output predictions are used by the downstream tasks (e.g., decision and/or control). The p-bits 110 in FIG. 1 allow for efficient stochastic NN inference to model sampled weights from the probability distribution and the accumulation of the current along vertical lines 102 to realize the MAC operations.

Figure 4:
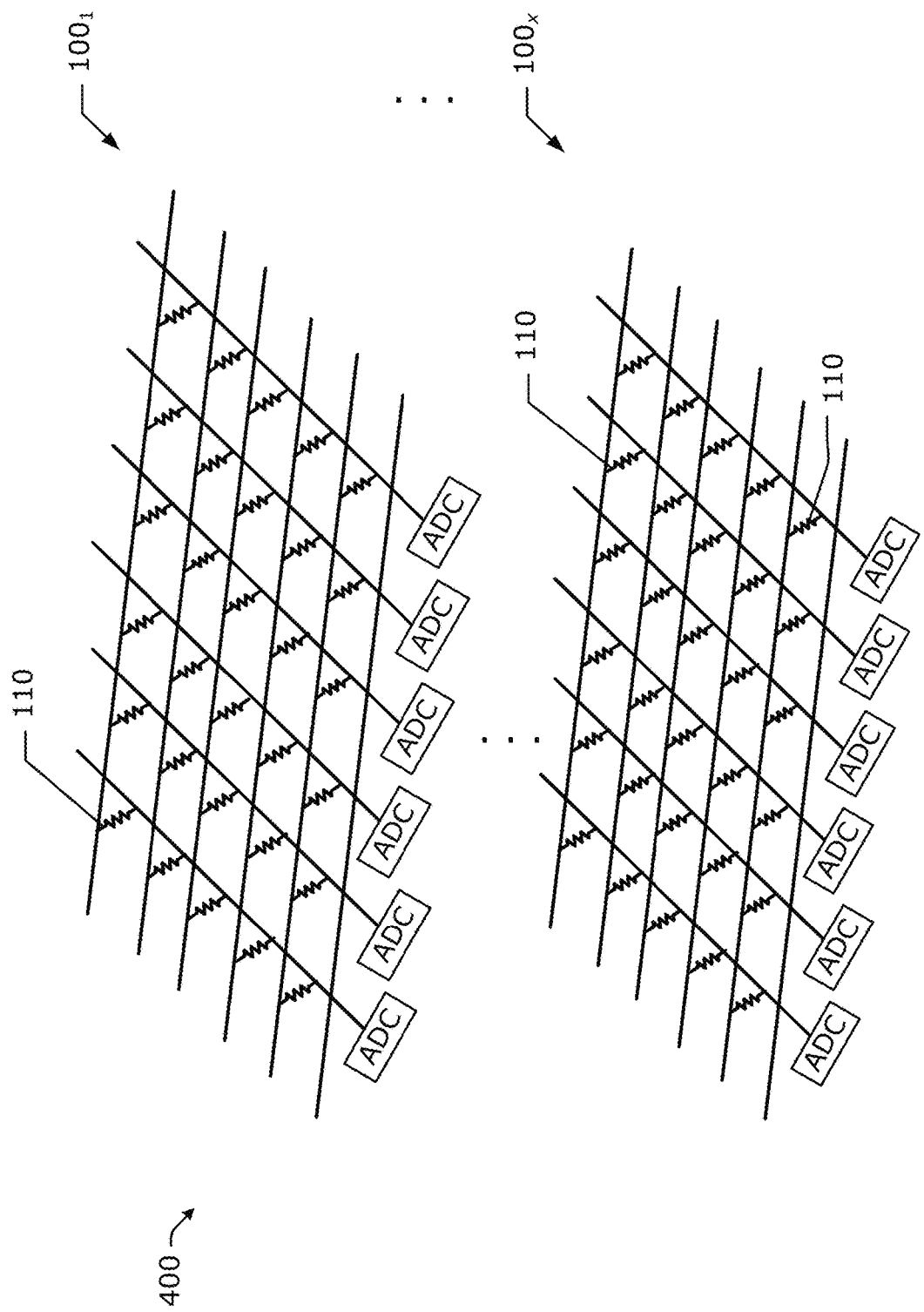
FIG. 4 depicts a three dimensional (3D) p-bit array stack according to various embodiments.

FIG. 4 shows a probabilistic computing device 400 according to various embodiments. The probabilistic computing device 400 is arranged into 3D p-bit array stack where a probabilistic computing units $100_1$ to $100_x$ (where x is a number) are stacked on one another vertically. Each of the probabilistic computing units $100_1$ to $100_x$ is an individual probabilistic computing unit 100 discussed previously with respect to FIG. 1. This stacked probabilistic computing device 400 increases the overall memory volume, which allows more parameters to be stored by the probabilistic computing device 400. Additionally, the peripheral circuit elements could be hidden below an array to save chip area and may be shared among various layers (e.g., inter-layer sharing) and within individual layers (e.g., intra-layer sharing).

The embodiments discussed herein accelerate VMM by MAC operation(s). In emerging probabilistic computing, such as in BNNs and/or Bayesian DNNs (DBNNs) models, weight generation (e.g., random number generation by certain distribution), weight moving, and input-weight multiplication (e.g., VMM) dominate in the BNN/DBNN computing workload. By replacing conventional two-state devices with stochastic devices (e.g., the p-bits 110 discussed herein), the VMM operations, as well as random number generation, can be handled in the same unit without incurring relatively large data transfer costs in terms of computational resource consumption.

In some implementations, the weight matrix of each ML model layer is stored in one or more probabilistic computing units 100. The full ML model can be accommodated by multiple probabilistic computing units 100, which may be stacked in the manner shown by FIG. 4. By providing input data to the probabilistic computing device 400, propagation can happen across multiple, different layers and complete the desired computation without the need to generate stochastic weight parameters and without the need to access the stochastic weight parameters from a separate memory device.

Figure 5:
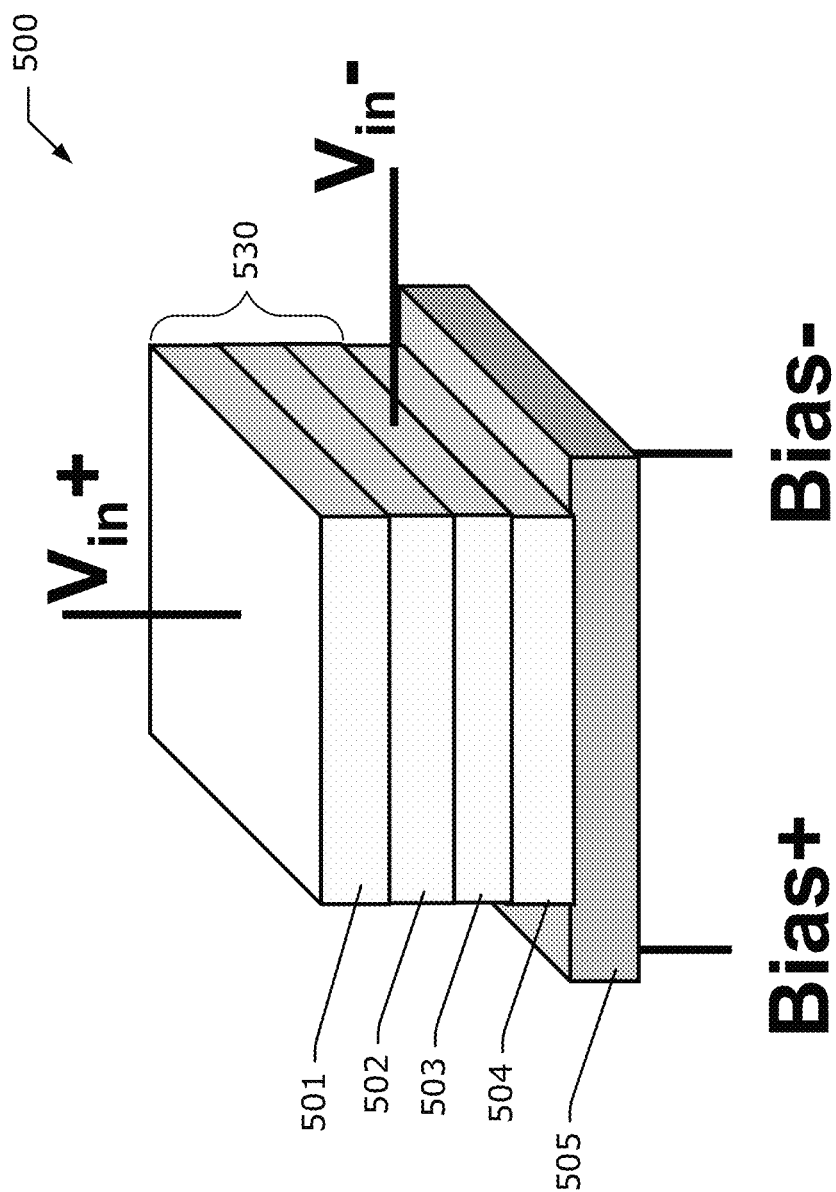
FIG. 5 depicts a perspective view of a spin-orbit torque tuned magnetic tunnel junction (MTJ) p-bit according to various embodiments.
Figure 6:
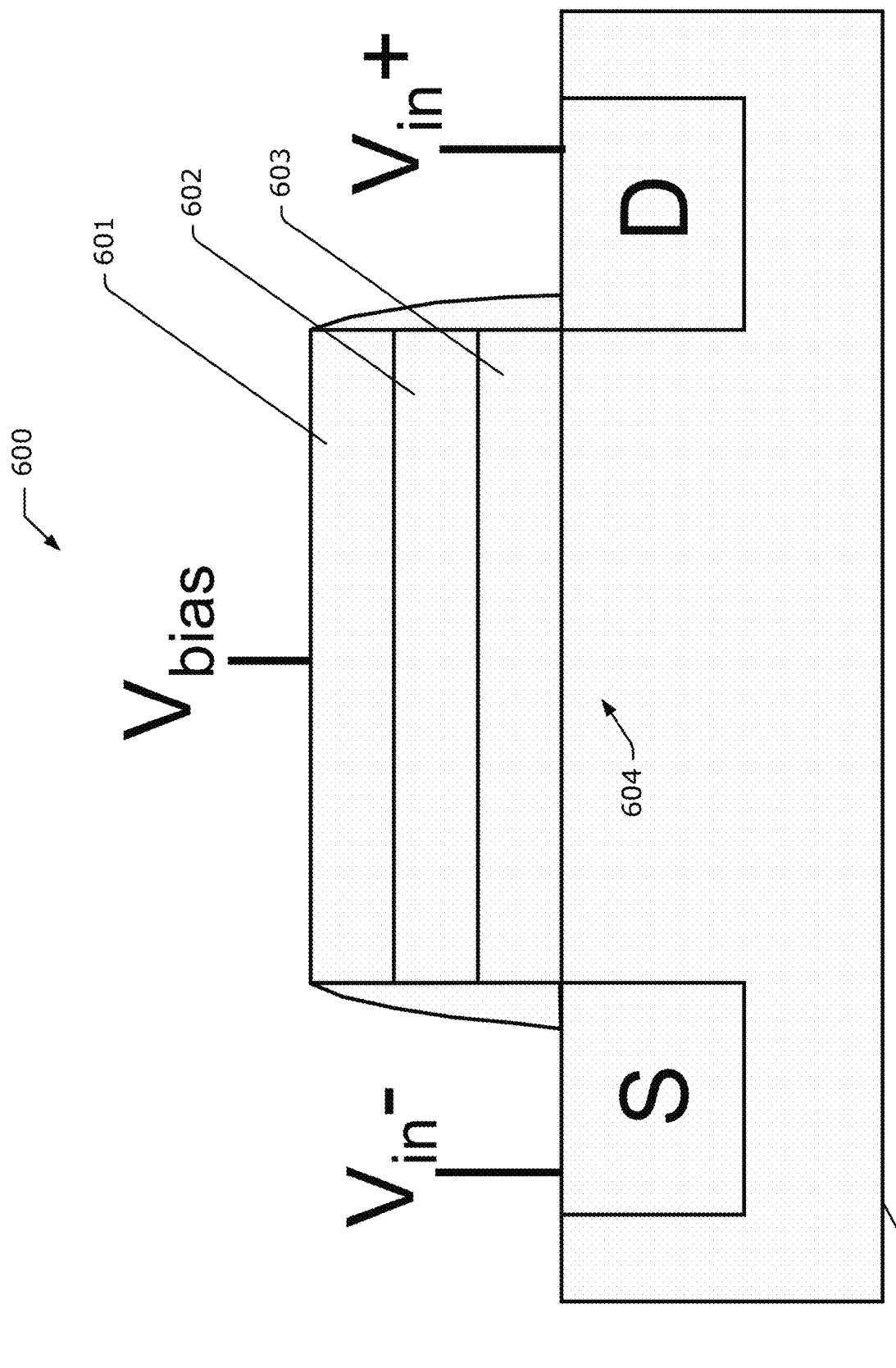
FIG. 6 depicts a cross-sectional view of a ferroelectric gate tuned field effect transistor (FEFET) according to various embodiments.
Figure 7:
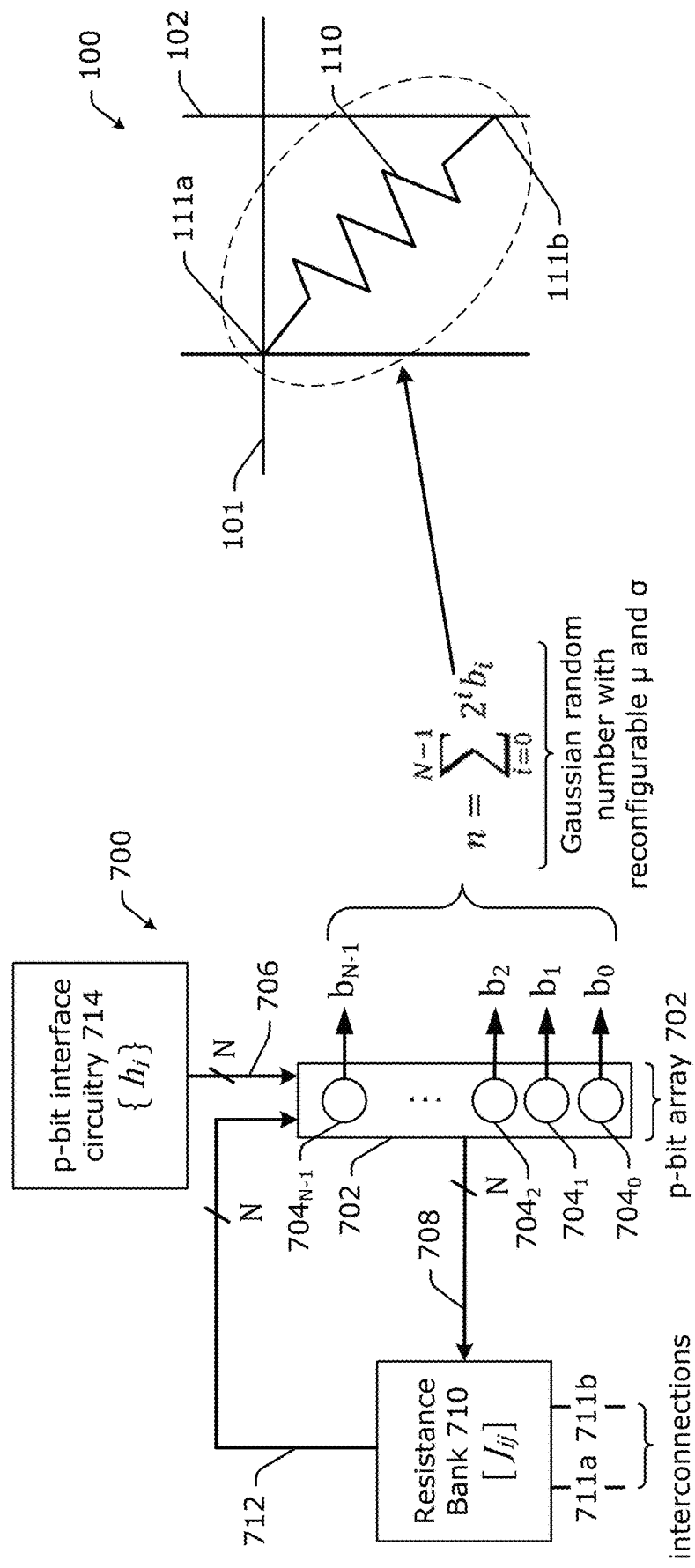
FIG. 7 depicts a random number generator according to various embodiments.

FIGS. 5 through 7 show different example implementations that may be used as p-bits 110 in FIGS. 1 and 4. In first implementations, only one type of p-bit implementation is used in the p-bit array 100 and/or probabilistic computing device 400. In one example, all of the p-bits 110 in a first probabilistic computing device 400 may be MTJ p-bit devices 500 shown by FIG. 5, all of the p-bits 110 in a second probabilistic computing device 400 may be FEFETs 600 shown by FIG. 6, and all of the p-bits 110 in a third probabilistic computing device 400 are based on the RNG 700 shown by FIG. 7.

Additionally or alternatively, in second implementations, different p-bit arrays 100 in the probabilistic computing device 400 use different p-bit implementations. For example, all of the p-bits 110 in a first p-bit array $100_1$ of a probabilistic computing device 400 may be MTJ p-bit devices 500 shown by FIG. 5, all of the p-bits 110 in a second p-bit array $100_{x-1}$ of the probabilistic computing device 400 may be FEFETs 600 shown by FIG. 6, and all of the p-bits 110 in a third p-bit array $100_x$ of the probabilistic computing device 400 may be based on the RNG 700 shown by FIG. 7. These p-bit arrays 100 having different p-bit implementations may be stacked and/or arranged in various configurations, depending on implementation and/or use cases.

Additionally or alternatively, in third implementations, individual columns within one p-bit array 100 may have different p-bit implementations. For example, all of the p-bits 110 connected to a first column $102_1$ of p-bit array 100 in FIG. 1 may be MTJ p-bit devices 500 shown by FIG. 5, all of the p-bits 110 connected to a second column 1022 of p-bit array 100 in FIG. 1 may be FEFETs 600 shown by FIG. 6, all of the p-bits 110 connected to a third column 1023 of p-bit array 100 in FIG. 1 may be based on the RNG 700 shown by FIG. 7, and so forth. The different columns of different p-bit implementations may be arranged in various configurations, depending on implementation and/or use cases.

Additionally or alternatively, fourth implementations may be a combination of the second and third implementations. For example, the first p-bit array $100_1$ in the second implementation may be stacked on top of a p-bit array 100 of the third implementation, which may then be stacked on top of the second p-bit array $100_{x-1}$ of the second implementation, and so forth. These p-bit arrays 100 may be stacked and/or arranged in various configurations, depending on implementation and/or use cases.

FIG. 5 shows a perspective view of a spin-orbit torque (SOT) tuned magnetic tunnel junction (MTJ) p-bit device 500, according to various embodiments. The SOT tuned MTJ p-bit device 500 (also referred to as "MTJ p-bit 500" or "p-bit 500") is one example structure of an individual p-bit 110 in the p-bit array 100. The MTJ p-bit 500 includes an MTJ layer 530 (also referred to as a "magnetization layer 530", "magnetization stack 530", or "MTJ 530") formed on a top barrier layer 504, which is formed on a spin-orbital coupling (SOC) layer 505. In some implementations, the SOC layer 505 may be a spin-orbit torque (SOT) bottom electrode (BE) (details regarding SOT is discussed in Shao et al., "Roadmap of Spin-Orbit Torques", arXiv: 2104.11459v2 (6 May 2021), which is hereby incorporated by reference in its entirety). The MTJ p-bit 500 also includes voltage input terminals ($V_{in}+$ and $V_{in}-$), and bias terminals (Bias+ and Bias−). The MTJ layer 530 includes a reference ferromagnetic layer 501 (also referred to as "ref layer 501"), a tunneling barrier layer 502, a free ferromagnetic layer 503 (also referred to as "free 503"). In some implementations, the MTJ p-bit 500 may have a same or similar structure as the MTJ devices discussed in U.S. application Ser. No. 17/550,663 (Attorney Docket No. AD5130-US) ("[AD5130]") and/or the MTJ devices discussed in U.S. application Ser. No. 17/467,124 filed on 3 Sep. 2021, the contents of which are hereby incorporated by reference in its entirety. The MTJ p-bit 500 may be formed using any suitable fabrication means (or combination of fabrication means) such as those discussed herein and/or those discussed in [AD5130] and/or [AD6641].

In various embodiments, the ref layer 501 and the free layer 503 may be formed of the same or different materials, some or all of which may be ferromagnetic (FM) materials. In some implementations, the ref layers 501 and/or the free layer 503 may be formed as a synthetic antiferromagnetic (SAF) as discussed in [AD5130] using one or more materials discussed herein and/or as discussed in [AD5130]. In these implementations, the SAF used for layer 501 and/or 503 includes of two oppositely oriented FM layers (e.g., $FM_1$ and $FM_2$) whose magnetic moments are designed to match each other such that the effective magnetic moment of the SAF structure is close to zero and any external magnetic field has a minimal effect on its energy. Any of the materials discussed infra may be used or the $FM_1$ and $FM_2$ layers making up the SAF. The $FM_1$ layer may be formed of a same or different material (or combination of materials) as used to form the $FM_2$ layer. Additionally, a normal metal (NM) layer may be disposed between the $FM_1$ and $FM_2$ layers, where the NM layer may be one of the materials discussed infra with respect to the layers 501 and 503 and/or as discussed in [AD5130]. The thickness of the $FM_1$, $FM_2$, and NM layers may be the same as those discussed in [AD5130].

In some implementations, the layers 501 and 503 may be formed of one or more of boron (B), manganese (Mn), iron (Fe), Co, Ru, tantalum (Ta), W, iridium (Ir), platinum (Pt), cobalt iron (CoFe), cobalt iron boron (CoFeB or CFB), iron boride (FeB), iridium manganese (IrMn), manganese phthalocyanine (MnPc), hafnium oxide ($HfO_2$), hafnium-zirconia ($HfZrO_2$), hafnium zirconium oxide ($Hf_xZr_{1-x}O_2$ (0.3≤x≤0.5)), zinc oxide (ZnO), Yttrium iron garnet ($Y_3Fe_5O_{12}$ or YIG), lead zirconate titanate ($Pb[Zr_xTi_{1-x}]O_3$ (0≤x≤1), barium titanate ($BaTiO_3$), bismuth ferrite ($BiFeO_3$), $Al_xSc_{1-x}N$ (0.6≤x≤0.9), $Al_xSc_{1-x}O_2$ (0.6≤x≤0.9), tungsten telluride ($WTe_2$), molybdenum telluride ($MoTe_2$), and/or any suitable combination thereof. One or more of the aforementioned materials may comprise its own film or layer, and some or all of these films may be layered in various combinations and arrangements. Furthermore, each of these films may have different thicknesses. For example, the thickness of each of these aforementioned material layers may be between 0.1 nanometers (nm) and 20 nm. In some implementations, the thickness of each of individual ones of the aforementioned material layers may be between 0.1 nanometers (nm) and 10 nm.

In some implementations, the layers 501 and 503 may be formed of the same materials (or the same combination of materials). In these implementations, the fabrication process can be different so that the properties of each of the layers 501 and 503 will still be different. For example, in these implementations, the ref layer 501 may be fabricated to have more anisotropy such that the magnetization stays relatively fixed, the free layer 503 can be fabricated in a manner that attempts to eliminate anisotropy of the free layer 503.

In some implementations, the tunneling barrier layer 502 may be formed of one or more of a suitable oxide such as magnesia or magnesium oxide (MgO) and/or aluminum oxide ($Al_2O_3$), or a suitable nitride such as boron nitride (BN), scandium nitride (ScN), gallium nitride (GaN), and/or the like, and/or combinations thereof. In some implementations, the top barrier layer 504 may be formed of any suitable material (or combination of materials) that allows current to tunnel through it, such as a nickel oxide (NiO, $NiO_2$, $Ni_2O_3$, etc.) and/or the like. In some implementations, the SOC layer 505 may be formed of a suitable silicon oxide such as silicon monoxide (SiO), silicon dioxide ($SiO_2$), and/or the like, and/or combinations thereof.

In the example of FIG. 5, applying a bias signal to the bias terminals sets a resistance value for the p-bit 500, and magnetoresistance is created between the voltage input terminals ($V_{in}+$ and $V_{in}-$) based on the resistance value of the bias signal. The magnetoresistance between the positive voltage input terminal ($V_{in}+$) and the negative voltage input terminal ($V_{in}-$) can be changed based on the parameters of the MTJ layer 530.

The MTJ layer 530 in this example is a three layer stack including a ref layer 501, which is formed on a tunneling barrier layer 502, wherein the tunneling barrier layer 502 is formed on the free layer 503, and the free layer 503 is formed on the top barrier layer 504. The ref layer 501 is formed of a material (or combination of materials) and in a manner such that it has a fixed magnetization, which does not change during operation of the p-bit 500. The free layer 503 is formed of a material whose magnetization changes freely and/or has no preferential polarity or polarization density. In other words, the free layer 503 is more magnetically isotropic than the ref layer 501, or the ref layer 501 is more magnetically anisotropic than the free layer 503.

By changing the magnetization of the free layer 503, the orientation of a magnetization vector of the p-bit 500 can be adjusted. This allows the p-bit 500 to act as an "in-plane magnet" or as a magnet with in-plane anisotropy, which means that the magnetization vector of the p-bit 500 can point in any direction (e.g., from zero to 360 degrees) in three-dimensional (3D) space. The overall resistance of the p-bit 500 can be adjusted by changing the orientation of the magnetization vector of the p-bit 500, and the orientation of the magnetization vector of the p-bit 500 can be altered by changing the relative magnetization between the ref layer 501 and the free layer 503.

By changing the relative magnetization between the ref layer 501 and the free layer 503, the p-bit 500 can be used to store a weight distribution (see e.g., FIG. 3 discussed supra). Accordingly, a distribution weight for a suitable ML model can be created by manipulating the polarity of the free layer 503. To manipulate the polarity of the free layer 503, the SOC layer 505 drives the MTJ 530 by varying the current and/or voltage between the positive bias terminal (Bias+) and the negative bias terminal (Bias−). The p-bit 500 with the SOC layer 505 biases the free layer 503 according to the mean μ of a desired distribution based on a value of the input current flowing between the Bias+ and Bias−. The current flowing in the SOC layer 505 between the Bias+ and Bias− creates the bias on the free layer 503 that creates the mean μ of the desired distribution. Additionally, the dimensions/geometry (e.g., thickness, length, height, etc.) and the specific materials used to form the free layer 503 fixes the standard deviation σ of the desired distribution.

During operation, the ref layer 501 is polarized in the plane of the ref layer 501, and the free layer 503 acts as a free nanomagnet whose direction of magnetization can fluctuate due to thermal fluctuations. When the orientation of the free nanomagnet (free layer 503) is aligned parallel with the ref layer 501, the resistance of the MJT p-bit 500 is low, and when the orientation of the free nanomagnet (free layer 503) is aligned anti-parallel with the ref layer 501, the resistance of the MJT p-bit 500 is high. The resistance of the MTJ p-bit 500 can be determined by the direction of the magnetization of the free layer 503 according to equation 1.

$$R_{MTJ} = R_0/(1 + P^2 \cos \varphi \sin \theta) \quad \text{(equation 1)}$$

In equation 1, $R_{MTJ}$ is the resistance of the MTJ p-bit 500, $R_0$ is the average resistance of the MTJ p-bit 500, P is the polarization of the MTJ p-bit 500, and θ is the polar angle of the free layer 503 magnetization with respect to the normal vector of the plane of the free layer 503, and φ is the azimuthal angle of the free layer 503 magnetization with respect to the normal vector of the plane of the free layer 503. The magnetization direction of the free layer 503 nanomagnet follows the Boltzmann distribution according to the equation 2.

$$p(\theta, \varphi) = 1/Z e^{-E(\theta, \varphi)/k_B T} \quad \text{(equation 2)}$$

In equation 2, p(θ, φ) is the probability of the magnetization being along the direction (θ, φ), E(θ, φ) is the energy for the direction (θ, φ), $k_B$ is the Boltzmann constant, T is the temperature, and Z is a partition function to normalize the probability function. Additionally or alternatively, Z is a normalization constant that makes the sum total probability for all (θ, φ) equal to 1. The energy function E depends on the interface anisotropy energy density $K_U$ of the free layer 503 (discussed infra).

By designing an appropriate energy function E, the probability distribution of the magnetization direction, and in turn that of the $R_{MTJ}$, can be engineered. E depends on the interface anisotropy energy density $K_U$ (discussed infra) of the free layer 503 nanomagnet, which can be controlled by applying a voltage to the Bias+ and the Bias– terminals. By varying the voltage/current between Bias+ and the Bias– terminals, the lateral charge current through the SOC layer 505 is converted to a vertical spin flow. The spin flow can switch the orientation of magnetization in the free layer 503. For instance, when current is passed through the SOC layer 505, the spin Hall effect results in an increased density of one spin state at the top of the SOC layer 505. The top barrier layer 504 is a dielectric layer and/or isolation layer disposed between the MTJ 530 and the SOC layer 505. The top barrier layer 504 is designed to allow a net spin current to propagate from the SOC layer 505 to the free layer 503. When a charge current is passed along the X-direction, a spin current flows along the Z-direction, with a spin polarization pointing in the ±Y direction, depending on the direction of the charge current flow. The spin polarization results in a spin torque on the free layer 503, providing a bias that can affect the in-plane orientation of the magnetization of the free layer 503 (i.e., the change in current changes the distribution of the azimuthal angle φ in equation 1). A bias in the azimuthal angle φ in equation 1 can shift the mean value of the resistance $R_{MTJ}$.

The stability of the free layer 503, which is characterized by the mean retention time τ of its magnetization state, is exponentially dependent on its thermal energy barrier $E_B$, as shown by equation 3.

$$\tau = \tau_0 * \exp\left(\frac{E_B}{k_B T}\right) \quad \text{(equation 3)}$$

In equation 3, exp( ) is an exponential function, $\tau_0$ is length of time referred to as the attempt time or attempt period, which is a material parameter, $k_B$ is the Boltzmann constant, and T is the temperature (e.g., an ambient temperature). The attempt time $\tau_0$ may have a value between $10^{-9}$ and $10^{-10}$ seconds depending on the magnetic properties of the material. Additionally, the energy barrier $E_B$ for the free layer 503 is given by the product of its effective anisotropy energy density $K_U$ and volume V, as shown by equation 4.

$$E_B = 0.5 * K_U * V \quad \text{(equation 4)}$$

A small $K_U$ can be obtained by designing an in-plane magnet with negligible shape anisotropy, thus making the energy barrier $E_B$ very small (e.g., $E_B \approx k_B T$). Due to low thermal stability, the magnetization of the free layer 503 fluctuates randomly in time, thereby producing random MTJ resistance states. The probability distribution characteristics of the MTJ resistance can be adjusted by the spin flow.

By connecting the $V_{in}-$ and $V_{in}+$ to the input lines 101 and vertical lines 102 at each crossing point, each MTJ p-bit 500 can serve as an individual p-bit 110. Additional operational aspects of the MTJ p-bit 500 are discussed in [AD5130] and [AD6641].

FIG. 6 depicts an example ferroelectric gate tuned field effect transistor (FEFET) 600 according to various embodiments. The FEFET 600 is a ferroelectric based p-bit device, which is another example structure of an individual p-bit 110 in the p-bit array 100. In some implementations, the FEFET 600 may have a same or similar structure as the FeFETs discussed in U.S. application Ser. No. 17/409,483 filed on 23 Aug. 2021, the contents of which are hereby incorporated by reference in its entirety. In this example, the FEFET 600 includes a top electrode (TE) layer 601 (also referred to as a "gate electrode layer 601") formed on a ferroelectric (FE) layer 602, where the FE layer 602 is formed on a dielectric layer 603, and the dielectric layer 603 is formed on a channel region 604 of a substrate 605. The substrate 605 includes source region S and drain region D (collectively referred to as "S/D regions"), with electrodes formed on each of the source region S and the drain region D. Furthermore, the FEFET 600 includes an input bias terminal ($V_{bias}$) and voltage input terminals ($V_{in}+$ and $V_{in}-$). The FEFET 600 may be formed using any suitable fabrication means (or combination of fabrication means) such as those discussed herein and/or those discussed in [AD5128].

The S/D regions may be any suitable n-doped or p-doped materials as discussed in [AD5128]. The substrate 605 may include a suitable semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. The FE layer 602 may be formed of a suitable ferroelectric material (or a combination of such materials) such as those discussed previously with respect to the ref layer 501 and/or the free layer 503 of FIG. 5.

The TE layer 601 may be formed of a suitable metal-based material (or a combination of such materials) such as, for example, aluminum (Al), polycrystalline silicon (poly-Si), titanium (Ti), Co, nickel (Ni), zirconium (Zr), Ru, palladium (Pd), Pt, hafnium (Hf), Ta, carbides of these materials (e.g., hafnium carbide (HfC), zirconium carbide (ZrC), titanium carbide (TiC), tantalum carbide (TaC), aluminum carbide (AlC), etc.), conductive metal oxides (e.g., ruthenium oxide ($RuO_2$), hafnium oxide ($HfO_2$), etc.), nitrides (e.g., titanium nitride (TiN), etc.), and/or the like. Additionally or alternatively, the TE layer 601 may include one or more layers of one or more gate dielectric materials, such as, for example, silicon dioxide ($SiO_2$), silicon oxynitride ($SiO_xN_y$), silicon nitride ($Si_3N_4$), and/or one or more high-k dielectric materials such as $HfO_2$, hafnium silicon oxide (HfSiO), hafnium silicate ($HfSiO_4$, $HfO_6Si_2$, etc.), hafnium silicon oxynitride (HfSiON), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium titanium oxide ($BaO_3Ti$), strontium titanium oxide or strontium titanate ($SrTiO_3$), barium strontium titanium oxide ($BaH_8O_6SrT_{12}$), yttrium oxide or yttria ($Y_2O_3$), $Al_2O_3$, lead scandium tantalum oxide or lead scandium tantalate ($Pb(Sc_xTa_{1-x})O_3$), lead zinc niobate ($Pb(Zn_{1/3}Nb_{2/3})O_3$), lutetium oxide ($Lu_2O_3$), gadolinium oxide ($Gd_2O_3$), gadolinium-silicon oxide ($GdSiO_x$), and/or some other high-k dielectric material and/or other dielectric material such as those discussed in [AD5128]. The dielectric layer 603 may be formed of a suitable dielectric material (or a combination of such materials) such as, for example, a silicon oxide (e.g., SiO, $SiO_2$, etc.) and/or any of the dielectric materials discussed previously with respect to the TE layer 601.

The FE layer 602 disposed between the TE layer 601 and the dielectric layer 603 allows the magnetization orientation of the FEFET 600 to be changed. By changing the orientation of the FE layer 602, a channel status of the channel 604 can also be changed. Here, the resistance for the p-bit 110 is based on the channel resistance between the source S and the drain D, which is adjusted according to the bias applied to the layer 601 via the $V_{bias}$ 612. Adding the bias signal to the $V_{bias}$ 612 changes the ferroelectric polarization of the FE layer 602, which in turn changes the magnetization properties of the channel 604.

In this example, the positive voltage input terminal ($V_{in}+$) and the negative voltage input terminal ($V_{in}-$) are connected to the input lines 101 and vertical lines 102 at each crossing point in the p-bit array 100 in FIG. 1. Here, a time-varying resistance comes from the source-channel-drain path. The $V_{bias}$ is used switch the FE layer 602 with a low coercive voltage $V_{coercive}$ stochastically by pulses with various widths, numbers, amplitudes, etc. Hence the FEFET 600 channel resistance will follow a certain distribution as well.

The FEFET 600 may have a single domain or multiple domains that can change the channel resistance more randomly. An FE domain is an area of oriented spontaneous polarization. Spontaneous polarization in FE materials is the property that the polar crystals show electric polarity even without an external electric field. FE materials show two or more spontaneous polarization states that can be changed from one state to another by the application of an electric field. Ferroelectric substances normally present separate regions called domains that have different spontaneous polarization directions. Additionally, the bias signal applied to the $V_{bias}$ could be a continuous voltage of various magnitudes, or the bias signal applied to the $V_{bias}$ could be a pulse with different pulse widths and/or amplitudes. Because of the different bias signal types and the different domain arrangements, the FEFET 600 has more degrees of freedom of setting the random value of resistance. Additional operational aspects of the FEFET 600 are discussed in [AD5128].

Since a customized probability distribution may be required for stochastics NNs, the p-bits 110 in the p-bit array 100 of FIG. 1 are configurable to realize a corresponding probability function. In such implementations, a random number generator (RNG) could be used at or near each crossing point 115 in the p-bit array 100 (e.g., at each intersection of the input lines 101 and vertical lines 102), or an individual RNG can be shared across multiple crossing points 115 the p-bit array 100 (e.g., where an individual RNG is connected in parallel with multiple p-bits 110). The tradeoff on the number of RNGs and connection arrangements may be dependent on the RNG complexity and/or the array density. FIG. 7 shows one example of such an RNG.

FIG. 7 shows an N-bit random number generator (RNG) circuitry 700 according to various embodiments. The RNG circuitry 700 generates random numbers in accordance with a desired probability distribution such as, for example, a Gaussian distribution. However, other distributions may be used in other embodiments.

The devices discussed previously with respect to FIGS. 5 and 6 provide compact solutions for RNG (e.g., Gaussian RNGs). Since the random numbers are directly derived from the $R_{MTJ}$, which can fluctuate among a continuum of values, the MTJ p-bit 500 and FEFET 600 have analogue precision as RNGs. The RNG circuitry 700 may be used to generate random numbers having prerequisite digital precision. The RNG circuitry 700 determines the distribution of the resistance for one whole p-bit 110. In this example, the terminals 711a and 711b of the resistance bank 710 may be connected to terminals 111a and 111b, respectively. In other implementations, a single RNG 700 may be used for multiple p-bits 110 where the terminals 711a and 711b of the resistance bank 710 may be connected to the multiple p-bits 110 in series or in parallel.

In this approach, the RNG circuitry 700 comprises N number of p-bits 704 (where N is a number). The N p-bits 704 (labeled p-bit $704_0$, p-bit $704_1$, p-bit $704_2$, and so forth to p-bit $704_{N-1}$ (where N is a number) in FIG. 7) form a p-bit array 702. The p-bits 704 are binary stochastic neurons (e.g., neurons 210 of FIG. 2 and/or nodes 310 of FIG. 3) that output digital values '1' or '0' with a probability that is controllable through their analogue input.

The N p-bits 704 in RNG circuitry 700 are interconnected through a resistance bank 710 (also referred to as "feedback matrix 710" or "interconnection matrix 710") representing a symmetric connection matrix J, where $J_{ij}=J_{ji}$ represents the strength of the connection between the $i^{th}$ p-bit 704 and the $j^{th}$ p-bit 704. An additional bias, $h_i$, is provided to the $i^{th}$ p-bit 704.

The resistance bank 710 implements an interconnection weights matrix $[J_{ij}]$, which includes various interconnection weights J. The p-bit interface circuitry 714 implements a bias vector $\{h_i\}$ that includes various bias values h. Means for determining appropriate values for. J and h are also discussed in [AD6641]. Each digital bit b uses a separate p-bit device 704, with an interconnection weight J represented by a corresponding resistance in the p-bit array 702. Each p-bit 704 is a digital bit that can take a value b (labelled $b_0$ to $b_{N-1}$) of either one or zero, and the value of each p-bit 704 fluctuates randomly. Each p-bit 704 has a bias h input that can bias the p-bit 704 to preferentially be a one or a zero. The bias h of each p-bit 704 is applied through the N-bit bus 706 from the p-bit interface circuitry 714. The output of the p-bit array 702 (e.g., bits $b_0$ to $b_{N-1}$) is fed to the resistance bank 710 through an N-bit bus 708. In some implementations, the resistance bank 710 determines a bias to apply to each p-bit 704 based on the value of the other p-bits 704. Additionally or alternatively, the resistance bank 710 determines a single resistance value 750 to be used in a corresponding p-bit 110 in the p-bit array 100 through the interconnections 711. Plotting a histogram for the total resistance values 750 from resistance bank 710 will follow the desired distribution.

Additionally, the probability density function (PDF) of n can be controlled by engineering $[J_{ij}]$ and $\{h_i\}$. Specifically, the distribution of the N bit output ($b_0$ to $b_{N-1}$) follows a customized distribution (e.g., a Gaussian distribution) where both the mean μ and the standard deviation σ can be adjusted with fine granularity by varying the interconnection weight $[J_{ij}]$ and bias values $\{h_i\}$. Furthermore, N bit precision can be obtained with the N p-bits 704. This provides more flexibility of tuning the parameter distribution so that a very fine tuned distribution can be obtained. In one example implementations, 16 bits b (e.g., N=16) may yield a nearly perfect Gaussian distribution.

In some implementations, the RNG 700 is a true RNG (TRNG). Each stochastic weight can have a dedicated Gaussian TRNG or one Gaussian TRNG can be shared by all the weights in a time multiplexed manner. Furthermore, n can be used together with the resistor bank (e.g., p-bit array 100) to set the value of each of the stochastic weights (e.g., individual p-bits 110). In this example, the interconnections 711 of the feedback matrix 710 are connected to terminals 111a and 111b of individual p-bits 110 (note that only one p-bit 110 is shown by FIG. 7 by way of example, but it should be understood that the interconnections 711 may be connected to other terminals 111a and 111b of other p-bits 110 shown by FIG. 1.

The N p-bits 704 generate a digital random number that has a Gaussian distribution with a reconfigurable mean μ and standard deviation σ which may be expressed as equation 5.

$$n = \Sigma_{i=0}^{N-1} 2^i b_i \qquad \text{(equation 5)}$$

In equation 5, $b_i$ is the digital output of the i-th bit, and n is the Gaussian random number for the p-bit 110. Additional aspects of the different elements of the RNG 700, and its operation are discussed in more detail in [AD6641]

2. Artificial Intelligence and Machine Learning Aspects

Machine learning (ML) involves programming computing systems to optimize a performance criterion using example (training) data and/or past experience. ML refers to the use and development of computer systems that are able to learn and adapt without following explicit instructions, by using algorithms and/or statistical models to analyze and draw inferences from patterns in data. ML involves using algorithms to perform specific task(s) without using explicit instructions to perform the specific task(s), but instead relying on learnt patterns and/or inferences. ML uses statistics to build mathematical model(s) (also referred to as "ML models" or simply "models") in order to make predictions or decisions based on sample data (e.g., training data). The model is defined to have a set of parameters, and learning is the execution of a computer program to optimize the parameters of the model using the training data or past experience. The trained model may be a predictive model that makes predictions based on an input dataset, a descriptive model that gains knowledge from an input dataset, or both predictive and descriptive. Once the model is learned (trained), it can be used to make inferences (e.g., predictions).

ML algorithms perform a training process on a training dataset to estimate an underlying ML model. An ML algorithm is a computer program that learns from experience with respect to some task(s) and some performance measure(s)/metric(s), and an ML model is an object or data structure created after an ML algorithm is trained with training data. In other words, the term "ML model" or "model" may describe the output of an ML algorithm that is trained with training data. After training, an ML model may be used to make predictions on new datasets. Additionally, separately trained AI/ML models can be chained together in a AI/ML pipeline during inference or prediction generation. Although the term "ML algorithm" refers to different concepts than the term "ML model," these terms may be used interchangeably for the purposes of the present disclosure. Any of the ML techniques discussed herein may be utilized, in whole or in part, and variants and/or combinations thereof, for any of the example embodiments discussed herein.

ML may require, among other things, obtaining and cleaning a dataset, performing feature selection, selecting an ML algorithm, dividing the dataset into training data and testing data, training a model (e.g., using the selected ML algorithm), testing the model, optimizing or tuning the model, and determining metrics for the model. Some of these tasks may be optional or omitted depending on the use case and/or the implementation used.

ML algorithms accept model parameters (or simply "parameters") and/or hyperparameters that can be used to control certain properties of the training process and the resulting model. Model parameters are parameters, values, characteristics, configuration variables, and/or properties that are learnt during training. Model parameters are usually required by a model when making predictions, and their values define the skill of the model on a particular problem. Hyperparameters at least in some embodiments are characteristics, properties, and/or parameters for an ML process that cannot be learnt during a training process. Hyperparameter are usually set before training takes place, and may be used in processes to help estimate model parameters.

ML techniques generally fall into the following main types of learning problem categories: supervised learning, unsupervised learning, and reinforcement learning. Supervised learning involves building models from a set of data that contains both the inputs and the desired outputs. Unsupervised learning is an ML task that aims to learn a function to describe a hidden structure from unlabeled data. Unsupervised learning involves building models from a set of data that contains only inputs and no desired output labels. Reinforcement learning (RL) is a goal-oriented learning technique where an RL agent aims to optimize a long-term objective by interacting with an environment. Some implementations of AI and ML use data and neural networks (NNs) in a way that mimics the working of a biological brain. An example of such an implementation is shown by FIG. 2.

3. Example Hardware and Software Configurations and Arrangements

Figure 8A:
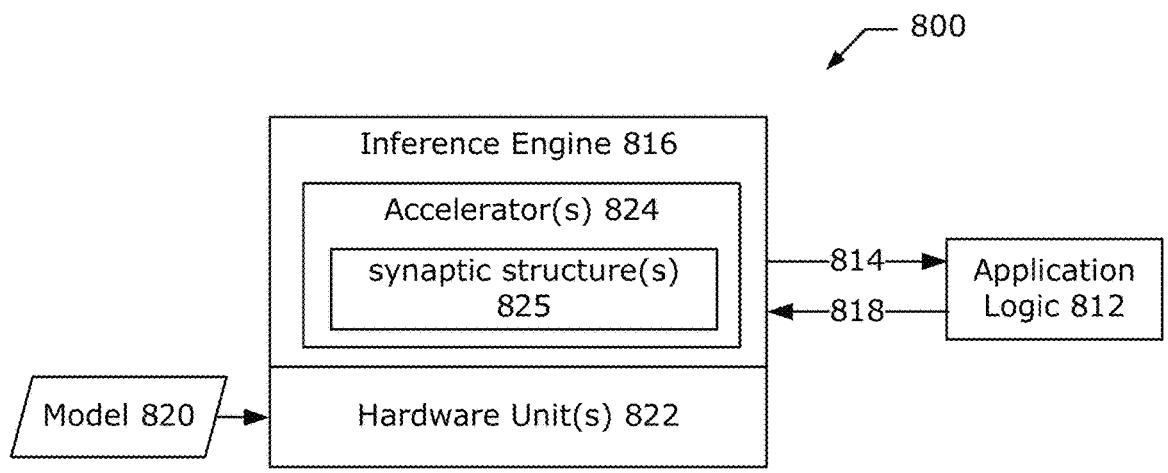
FIG. 8a illustrates an example accelerator architecture.

FIG. 8a is an example accelerator architecture 800 for according to various embodiments. The accelerator architecture 800 provides neural network (NN) functionality to application logic 812, and as such, may be referred to as a NN accelerator architecture 800, DNN accelerator architecture 800, and/or the like.

The application logic 812 may include application SW and/or HW components used to perform specification functions. The application logic 812 forwards data 814 to an inference engine 816. The inference engine 816 is a runtime element that delivers a unified application programming interface (API) that integrates a ANN (e.g., DNN(s) or the like) inference with the application logic 812 to provide a result 818 (or output) to the application logic 812.

To provide the inference, the inference engine 816 uses a model 820 that controls how the DNN inference is made on the data 814 to generate the result 818. Specifically, the model 820 includes a topology of layers of a NN. The topology includes an input layer that receives the data 814, an output layer that outputs the result 818, and one or more hidden layers between the input and output layers that provide processing between the data 14 and the result 818. The topology may be stored in a suitable information object, such as an extensible markup language (XML), JavaScript Object Notation (JSON), and/or other suitable data structure, file, and/or the like. The model 820 may also include weights and/or biases for results for any of the layers while processing the data 814 in the inference using the DNN.

The inference engine 816 may be implemented using and/or connected to HW unit(s) 822. The inference engine 816 at least in some embodiments is an element that applies logical rules to a knowledge base to deduce new information. The knowledge base at least in some embodiments is any technology used to store complex structured and/or unstructured information used by a computing system (e.g., compute node 850 of FIG. 8). The knowledge base may include storage devices, repositories, database management systems, and/or other like elements.

Furthermore, the inference engine 816 includes one or more accelerators 824 that provide HW acceleration for the DNN inference using one or more HW units 822. The accelerator(s) 824 are SW and/or HW element(s) specifically tailored/designed as HW acceleration for AI/ML applications and/or AI/ML tasks. The one or more accelerators 824 may include one or more processing element (PE) arrays and/or a multiply-and-accumulate (MAC) architecture in the form of a plurality of synaptic structures 825. The accelerator(s) 824 may correspond to the acceleration circuitry 864 of FIG. 8 described infra.

The HW unit(s) 822 may include one or more processors and/or one or more programmable devices. As examples, the processors may include central processing units (CPUs), graphics processing units (GPUs), dedicated AI accelerator Application Specific Integrated Circuits (ASICs), vision processing units (VPUs), tensor processing units (TPUs) and/or Edge TPUs, Neural Compute Engine (NCE), Pixel Visual Core (PVC), photonic integrated circuit (PIC) or optical/photonic computing device, and/or the like. The programmable devices may include, for example, logic arrays, programmable logic devices (PLDs) such as complex PLDs (CPLDs), field-programmable gate arrays (FPGAs), programmable ASICs, programmable System-on-Chip (SoC), and the like. The processor(s) and/or programmable devices may correspond to processor circuitry 852 and/or acceleration circuitry 864 of FIG. 8. In particular, the one or more accelerators 824 and/or HW unit(s) 822 may include a plurality of synaptic structures 825, which may be configured or arranged according to the various embodiments shown and described with respect to FIGS. 1-7.

Figure 8B:
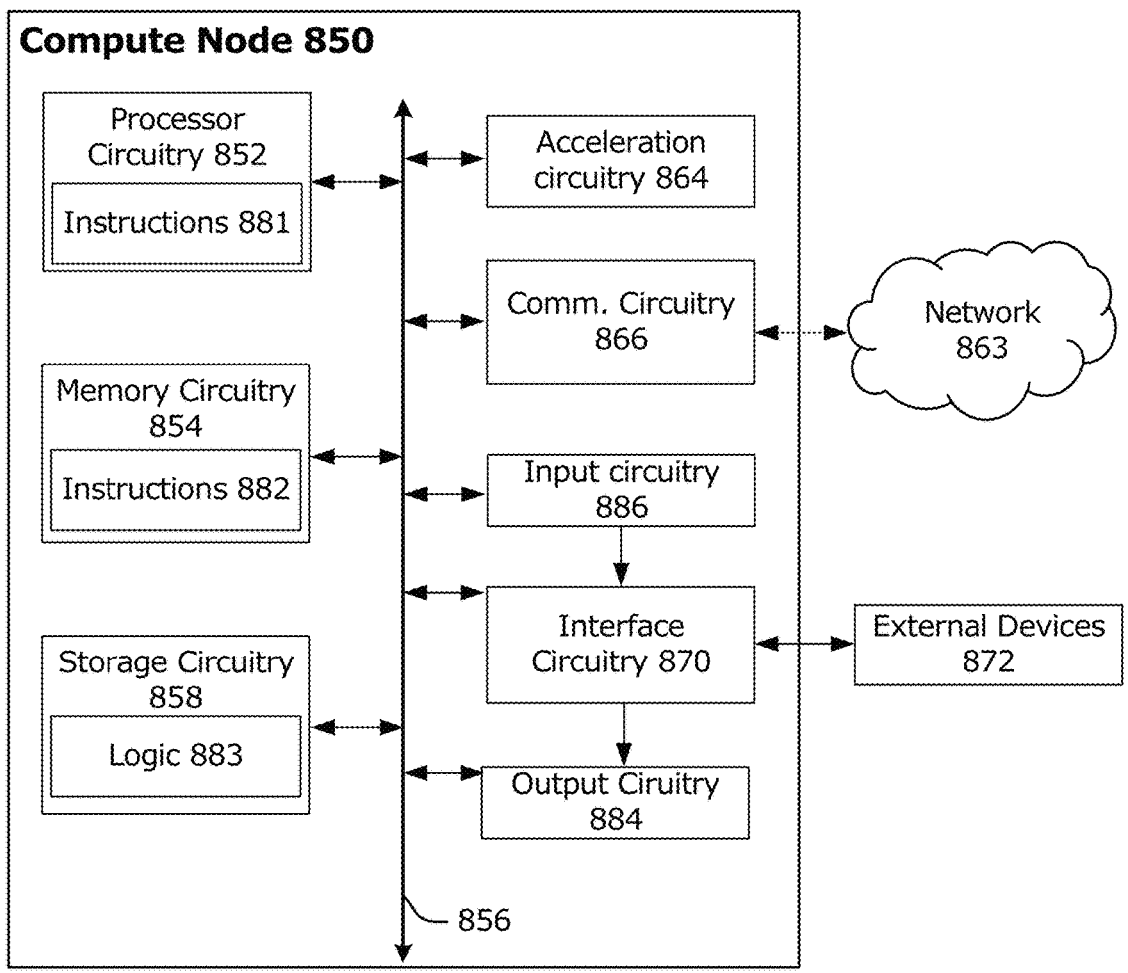
FIG. 8b illustrates example components of a computing system.

FIG. 8b illustrates an example of components that may be present in a compute node 850 for implementing the techniques (e.g., operations, processes, methods, and methodologies) described herein. FIG. 8b provides a view of the components of node 850 when implemented as part of a computing device (e.g., as a mobile device, a base station, server computer, gateway, appliance, etc.). The compute node 850 may include any combinations of the HW or logical components referenced herein, and it may include or couple with any device usable with an edge communication network or a combination of such networks. The components may be implemented as ICs, portions thereof, discrete electronic devices, or other modules, instruction sets, programmable logic or algorithms, HW, HW accelerators, software (SW), firmware, or a combination thereof adapted in the compute node 850, or as components otherwise incorporated within a chassis of a larger system. For one embodiment, at least one processor 852 may be packaged together with computational logic 882 and configured to practice aspects of various example embodiments described herein to form a System in Package (SiP) or a System on Chip (SoC).

The node 850 includes processor circuitry in the form of one or more processors 852. The processor circuitry 852 includes circuitry such as, but not limited to one or more processor cores and one or more of cache memory, low drop-out voltage regulators (LDOs), interrupt controllers, serial interfaces such as SPI, I²C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 852 may include one or more HW accelerators (e.g., same or similar to acceleration circuitry 864), which may be microprocessors, programmable processing devices (e.g., FPGA, ASIC, etc.), or the like. The one or more accelerators may include, for example, computer vision and/or deep learning accelerators. In some implementations, the processor circuitry 852 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 852 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 852 may be coupled with or may include memory/storage and may be configured to execute instructions 881 stored in the memory/storage to enable various applications or operating systems to run on the platform 850. The processors (or cores) 852 is configured to operate application SW to provide a specific service to a user of the platform 850. In some embodiments, the processor(s) 852 may be a special-purpose processor(s)/controller(s) configured (or configurable) to operate according to the various embodiments herein.

As examples, the processor(s) 852 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centrig™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 852 may be a part of a system on a chip (SoC), System-in-Package (SiP), a multi-chip package (MCP), and/or the like, in which the processor(s) 852 and other components are formed into a single integrated circuit, or a single package, such as the Edison™ or Galileo™ SoC boards from Intel® Corporation. Other examples of the processor(s) 852 are mentioned elsewhere in the present disclosure.

The node 850 may include or be coupled to acceleration circuitry 864, which may be embodied by one or more AI/ML accelerators, a neural compute stick, neuromorphic HW, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 864 may comprise logic blocks or logic fabric and other interconnected resources that may be programmed (configured) to perform various functions, such as the procedures, methods, functions, etc. of the various embodiments discussed herein. In such implementations, the acceleration circuitry 864 may also include memory cells (e.g., EPROM, EEPROM, flash memory, static memory (e.g., SRAM, antifuses, etc.) used to store logic blocks, logic fabric, data, etc. in LUTs and the like.

In some implementations, the processor circuitry 852 and/or acceleration circuitry 864 may include HW elements specifically tailored for machine learning functionality, such as for operating performing ANN operations such as those discussed herein. In these implementations, the processor circuitry 852 and/or acceleration circuitry 864 may be, or may include, an AI engine chip that can run many different kinds of AI instruction sets once loaded with the appropriate weightings and training code. Additionally or alternatively, the processor circuitry 852 and/or acceleration circuitry 864 may be, or may include, AI accelerator(s), which may be one or more of the aforementioned HW accelerators designed for HW acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphaICs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, HW 3 provided by Tesla®, Inc., an Epiphany™ based processor provided by Adapteva®, or the like. In some embodiments, the processor circuitry 852 and/or acceleration circuitry 864 and/or HW accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin 970 provided by Huawei®, and/or the like. In some HW-based implementations, individual subsystems of node 850 may be operated by the respective AI accelerating co-processor(s), AI GPUs, TPUs, or HW accelerators (e.g., FPGAs, ASICs, DSPs, SoCs, etc.), etc., that are configured with appropriate logic blocks, bit stream(s), etc. to perform their respective functions.

The node 850 also includes system memory 854. Any number of memory devices may be used to provide for a given amount of system memory. As examples, the memory 854 may be, or include, volatile memory such as random access memory (RAM), static RAM (SRAM), dynamic RAM (DRAM), synchronous DRAM (SDRAM), RAMBUS® Dynamic Random Access Memory (RDRAM®), and/or any other desired type of volatile memory device. Additionally or alternatively, the memory 854 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 854 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 858 provides persistent storage of information such as data, applications, operating systems and so forth. In an example, the storage 858 may be implemented via a solid-state disk drive (SSDD) and/or high-speed electrically erasable memory (commonly referred to as "flash memory"). Other devices that may be used for the storage 858 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 854 and/or storage circuitry 858 may also incorporate three-dimensional (3D) cross-point (XPOINT) memories from Intel® and Micron®.

The memory circuitry 854 and/or storage circuitry 858 is/are configured to store computational logic 883 in the form of SW, firmware, microcode, or HW-level instructions to implement the techniques described herein. The computational logic 883 may be employed to store working copies and/or permanent copies of programming instructions, or data to create the programming instructions, for the operation of various components of system 800 (e.g., drivers, libraries, application programming interfaces (APIs), etc.), an operating system of system 800, one or more applications, and/or for carrying out the embodiments discussed herein. The computational logic 883 may be stored or loaded into memory circuitry 854 as instructions 882, or data to create the instructions 882, which are then accessed for execution by the processor circuitry 852 to carry out the functions described herein. The processor circuitry 852 and/or the acceleration circuitry 864 accesses the memory circuitry 854 and/or the storage circuitry 858 over the IX 856. The instructions 882 direct the processor circuitry 852 to perform a specific sequence or flow of actions, for example, as described with respect to flowchart(s) and block diagram(s) of operations and functionality depicted previously. The various elements may be implemented by assembler instructions supported by processor circuitry 852 or high-level languages that may be compiled into instructions 881, or data to create the instructions 881, to be executed by the processor circuitry 852. The permanent copy of the programming instructions may be placed into persistent storage devices of storage circuitry 858 in the factory or in the field through, for example, a distribution medium (not shown), through a communication interface (e.g., from a distribution server (not shown)), over-the-air (OTA), or any combination thereof.

The IX 856 couples the processor 852 to communication circuitry 866 for communications with other devices, such as a remote server (not shown) and the like. The communication circuitry 866 is a HW element, or collection of HW elements, used to communicate over one or more networks 863 and/or with other devices. In one example, communication circuitry 866 is, or includes, transceiver circuitry configured to enable wireless communications using any number of frequencies and protocols such as, for example, the Institute of Electrical and Electronics Engineers (IEEE) 802.11 (and/or variants thereof), IEEE 802.15.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 866 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others. In some embodiments, the communication circuitry 866 may include or otherwise be coupled with the an accelerator 824 including one or more synaptic devices/structures 825, etc., as described previously, in accordance with various embodiments.

The IX 856 also couples the processor 852 to interface circuitry 870 that is used to connect node 850 with one or more external devices 872. The external devices 872 may include, for example, sensors, actuators, positioning circuitry (e.g., global navigation satellite system (GNSS)/Global Positioning System (GPS) circuitry), client devices, servers, network elements and/or network appliances (e.g., switches, hubs, routers, etc.), HW accelerator(s) 800, integrated photonics devices (e.g., optical neural network (ONN) integrated circuit (IC) and/or the like), and/or other like devices.

The sensors includes devices, modules, or subsystems whose purpose is to detect events or changes in its environment and send the information (sensor data) about the detected events to some other a device, module, subsystem, etc. Examples of such sensors include, inter alia, inertia measurement units (IMU) comprising accelerometers, gyroscopes, and/or magnetometers; microelectromechanical systems (MEMS) or nanoelectromechanical systems (NEMS) comprising 3-axis accelerometers, 3-axis gyroscopes, and/or magnetometers; level sensors; flow sensors; temperature sensors (e.g., thermistors, including sensors for measuring the temperature of internal components and sensors for measuring temperature external to the compute node 850); pressure sensors; barometric pressure sensors; gravimeters; altimeters; image capture devices (e.g., cameras); light detection and ranging (LiDAR) sensors; proximity sensors (e.g., infrared radiation detector and the like); depth sensors, ambient light sensors; optical light sensors; ultrasonic transceivers; microphones; and the like.

The actuators, allow the compute node 850 to change its state, position, and/or orientation, or move or control a mechanism or system. The actuators comprise electrical and/or mechanical devices for moving or controlling a mechanism or system, and converts energy (e.g., electric current or moving air and/or liquid) into some kind of motion. The actuators may include one or more electronic (or electrochemical) devices, such as piezoelectric biomorphs, solid state actuators, solid state relays (SSRs), shape-memory alloy-based actuators, electroactive polymer-based actuators, relay driver integrated circuits (ICs), and/or the like. The actuators may include one or more electromechanical devices such as pneumatic actuators, hydraulic actuators, electromechanical switches including electromechanical relays (EMRs), motors (e.g., DC motors, stepper motors, servomechanisms, etc.), power switches, valve actuators, wheels, thrusters, propellers, claws, clamps, hooks, audible sound generators, visual warning devices, and/or other like electromechanical components. The compute node 850 may be configured to operate one or more actuators based on one or more captured events and/or instructions or control signals received from a service provider and/or various client systems.

In some optional examples, various input/output (I/O) devices may be present within or connected to, the node 850, which are referred to as input circuitry 886 and output circuitry 884 in FIG. 8. The input circuitry 886 and output circuitry 884 include one or more user interfaces designed to enable user interaction with the platform 850 and/or peripheral component interfaces designed to enable peripheral component interaction with the platform 850. Input circuitry 886 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 884 may be included to show information or otherwise convey information, such as sensor readings, actuator position(s), or other like information. Data and/or graphics may be displayed on one or more user interface components of the output circuitry 884. Output circuitry 884 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Chrystal Displays (LCD), LED displays, quantum dot displays, projectors, etc.), with the output of characters, graphics, multimedia objects, and the like being generated or produced from the operation of the platform 850. The output circuitry 884 may also include speakers and/or other audio emitting devices, printer(s), and/or the like. Additionally or alternatively, sensor(s) may be used as the input circuitry 884 (e.g., an image capture device, motion capture device, or the like) and one or more actuators may be used as the output device circuitry 884 (e.g., an actuator to provide haptic feedback or the like). Peripheral component interfaces may include, but are not limited to, a non-volatile memory port, a USB port, an audio jack, a power supply interface, etc. A display or console HW, in the context of the present system, may be used to provide output and receive input of an edge computing system; to manage components or services of an edge computing system; identify a state of an edge computing component or service; or to conduct any other number of management or administration functions or service use cases.

The components of the node 850 may communicate over the interconnect (IX) 856. The IX 856 may include any number of technologies, including Industry Standard Architecture (ISA) and/or extended ISA (EISA), FASTBUS, Low Pin Count (LPC) bus, Inter-Integrated Circuit (I$^2$C), Serial Peripheral Interface (SPI), power management bus (PMBus), peripheral component IX (PCI), PCI express (PCIe), PCI extended (PCIx), Intel® QuickPath IX (QPI), Intel® Ultra Path IX (UPI), Intel® Accelerator Link, Compute Express Link (CXL), Coherent Accelerator Processor Interface (CAPI) and/or OpenCAPI, Intel® Omni-Path Architecture (OPA), RapidIO™, cache coherent interconnect for accelerators (CCIX), Gen-Z Consortium, HyperTransport and/or Lightning Data Transport (LDT), NVLink provided by NVIDIA®, InfiniBand (IB), Time-Trigger Protocol (TTP), FlexRay, PROFIBUS, Ethernet, Universal Serial Bus (USB), point-to-point interfaces, and/or any number of other IX technologies. The IX 856 may be a proprietary bus, for example, used in a SoC based system.

The number, capability, and/or capacity of the elements of the compute node 850 may vary, depending on whether compute node 850 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the compute node 850 may comprise one or more components of a data center such as one or more servers and/or switches (or switch fabric), a desktop computer, a workstation, a laptop, a smartphone, a tablet, a digital camera, a smart appliance, a smart home hub, a network appliance, a drone or robot, an autonomous vehicle, and/or any other device/system that processes data.

In one example implementation, the compute node 850 may be, or may be part of an appliance computing device that is a self-contained electronic device including a housing, a chassis, a case or a shell. In some circumstances, the housing may be dimensioned for portability such that it can be carried by a human and/or shipped. Additionally or alternatively, the housing may be a smaller module suitable for installation in a vehicle or in an outdoors location (e.g., a utility pole, side of a building, on a tree or rock, and/or the like). Example housings may include materials that form one or more exterior surfaces that partially or fully protect contents of the appliance, in which protection may include weather protection, hazardous environment protection (e.g., EMI, vibration, extreme temperatures), and/or enable submergibility. Example housings may include power circuitry to provide power for stationary and/or portable implementations, such as AC power inputs, DC power inputs, AC/DC or DC/AC converter(s), power regulators, transformers, charging circuitry, batteries, wired inputs and/or wireless power inputs. Smaller, modular implementations may also include an extendible or embedded antenna arrangement for wireless communications. Example housings and/or surfaces thereof may include or connect to mounting HW to enable attachment to structures such as buildings, telecommunication structures (e.g., poles, antenna structures, etc.) and/or racks (e.g., server racks, blade mounts, etc.). Example housings and/or surfaces thereof may support one or more sensors (e.g., temperature sensors, vibration sensors, light sensors, acoustic sensors, capacitive sensors, proximity sensors, etc.). One or more such sensors may be contained in, carried by, or otherwise embedded in the surface and/or mounted to the surface of the appliance. Example housings and/or surfaces thereof may support mechanical connectivity, such as propulsion HW (e.g., wheels, propellers, etc.) and/or articulating HW (e.g., robot arms, pivotable appendages, etc.). In some circumstances, the sensors may include any type of input devices such as user interface HW (e.g., buttons, switches, dials, sliders, etc.). In some circumstances, example housings include output devices contained in, carried by, embedded therein and/or attached thereto. Output devices may include displays, touchscreens, lights, LEDs, speakers, I/O ports (e.g., USB, Lightning, Ethernet, etc.), etc. In some circumstances, the compute node 850 may be deployed in a network for a specific purpose (e.g., a traffic light, road side unit, surveillance camera, IoT device and/or autonomous sensors, etc.), but may have processing and/or other capacities that may be utilized for other purposes. Such compute nodes 850 may be independent from other networked devices and may be provided with a housing having a form factor suitable for its primary purpose; yet be available for other compute tasks that do not interfere with its primary task. The compute node 850 may include HW and SW components to manage local issues such as device temperature, vibration, resource utilization, updates, power issues, physical and network security, etc. These HW and SW components to manage local issues may be used to adapt an ML model being operated by the compute node 850 according to the various embodiments discussed herein.

In another example implementation, the compute node 850 may be, or may be included in one or more servers. Such a server may include an operating system and implement a virtual computing environment. A virtual computing environment may include a hypervisor managing (e.g., spawning, deploying, destroying, etc.) one or more virtual machines, one or more containers, etc. Such virtual computing environments provide an execution environment in which one or more applications and/or other SW, code or scripts may execute while being isolated from one or more other applications, SW, code or scripts.

4. Example Implementations

Figure 9:
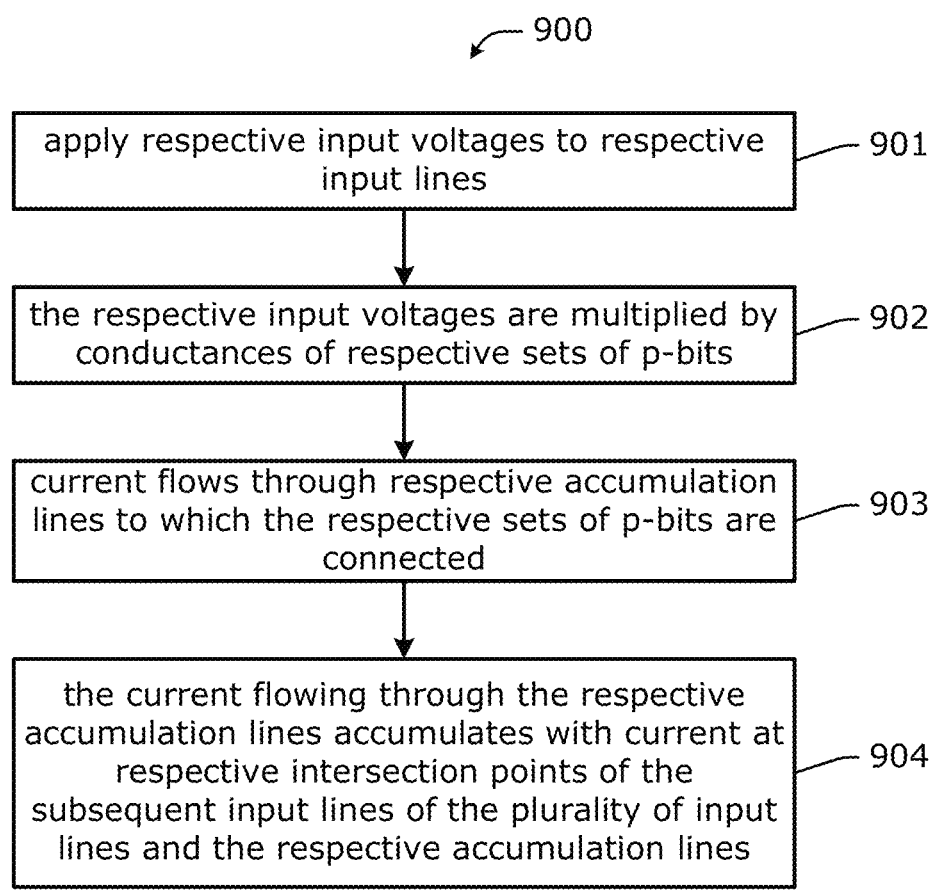
FIG. 9 depict example procedures that may be used to practice the various embodiments discussed herein.

FIG. 9 shows an example process 900 for probabilistic in-memory computing of a stochastic neural network (SNN) by a probabilistic in-memory computing apparatus (e.g., probabilistic computing unit 100 and/or probabilistic computing device 400). In this example, the probabilistic in-memory computing apparatus comprises a plurality of input lines 101, a plurality of accumulation lines 102 intersecting the plurality of input lines 101; and a plurality of p-bits 110, each of which is coupled to an individual input line 101 of the plurality of input lines 101 and an individual accumulation line 102 of the plurality of accumulation lines 102, and each p-bit 110 is a time-varying resistance device having a probabilistic resistance value based on a probability distribution of the SNN. Process 900 begins at operation 901 where respective input voltages are applied to respective input lines 101 of the plurality of input lines 101. At operation 902, the respective input voltages are multiplied by conductances of respective sets of p-bits 110 of the plurality of p-bits 110 connected to the respective input lines 101. At operation 903, the current flows through respective accumulation lines 102 to which the respective sets of p-bits 110 are connected. At operation 904, the current flowing through the respective accumulation lines 102 accumulates with current at respective intersection points of the subsequent input lines 101 of the plurality of input lines 101 and the respective accumulation lines 102.

Additional examples of the presently described embodiments include the following, non-limiting example implementations. Each of the following non-limiting examples may stand on its own or may be combined in any permutation or combination with any one or more of the other examples provided below or throughout the present disclosure.

Example A01 includes a probabilistic in-memory computing apparatus for a stochastic neural network (SNN), the apparatus comprising: a plurality of input lines arranged parallel to one another; a plurality of accumulation lines arranged parallel to one another and intersecting the plurality of input lines; and a plurality of probabilistic bit devices (p-bits), each p-bit of the plurality of p-bits is coupled to an input line of the plurality of input lines and an accumulation line of the plurality of accumulation lines, and wherein each p-bit is a time-varying resistance device having a probabilistic resistance value based on a probability distribution of the SNN.

Example A02 includes the apparatus of example A01 and/or some other example(s) herein, wherein the plurality of input lines are arranged perpendicular to the plurality of accumulation lines in a lateral or longitudinal plane.

Example A03 includes the apparatus of example A02 and/or some other example(s) herein, wherein: each input line of the plurality of input lines is laterally separated from other input lines of the plurality of input lines, each accumulation line of the plurality of accumulation lines is laterally separated from other accumulation lines of the plurality of accumulation lines, and each input line is longitudinally separated from each accumulation line.

Example A04 includes the apparatus of examples A02-A03 and/or some other example(s) herein, wherein each p-bit includes a first terminal and a second terminal, wherein the first terminal of each p-bit is connected to a corresponding input line of the plurality of input lines and the second terminal of each p-bit is connected to a corresponding accumulation line of the plurality of accumulation lines.

Example A05 includes the apparatus of example A04 and/or some other example(s) herein, wherein the second terminal of each p-bit is connected to a portion of the corresponding accumulation line that precedes an intersection point between the corresponding accumulation line and another input line of the plurality of input lines to which another p-bit of the plurality of p-bits is connected.

Example A06 includes the apparatus of examples A02-A05 and/or some other example(s) herein, wherein: a first input voltage to be applied to a first input line of the plurality of input lines is multiplied by a conductance of a first set of p-bits of the plurality of p-bits connected to the first input line, and is to cause first current to flow through respective accumulation lines to which the first set of p-bits are connected, a second input voltage to be applied to a second input line of the plurality of input lines is multiplied by a conductance of a second set of p-bits of the plurality of p-bits connected to the second input line, and is to cause second current to flow through respective accumulation lines to which the second set of p-bits are connected, and the first current is to accumulate with the second current at respective intersection points of the second input line and the respective accumulation lines.

Example A07 includes the apparatus of examples A01-A06 and/or some other example(s) herein, wherein accumulation of current along each accumulation line of the plurality of accumulation lines is a respective multiply-and-accumulate (MAC) operation.

Example A08 includes the apparatus of examples A01-A07 and/or some other example(s) herein, further comprising: a plurality of analog-to-digital converters (ADCs), wherein each ADC of the plurality of ADCs is connected to a corresponding ADC of the plurality of accumulation lines, and each ADC is configured to convert accumulated current from the corresponding ADC into a respective digital signal.

Example A09 includes the apparatus of example A01 and/or some other example(s) herein, wherein the probabilistic resistance value of individual p-bits of the plurality of p-bits is an element of a weight matrix of the SNN, and the weight matrix comprises weights for one layer of the SNN.

Example A10 includes the apparatus of examples A01-A09 and/or some other example(s) herein, wherein the time-varying resistance device is a spin-orbit torque (SOT) tuned magnetic tunnel junction (MTJ) device comprising: a spin-orbital coupling (SOC) layer; a top barrier layer disposed on the SOC layer; a free ferromagnetic layer disposed on the top barrier layer; a tunneling barrier layer disposed on the free ferromagnetic layer; and a reference ferromagnetic layer disposed on the tunneling barrier layer, and wherein the free ferromagnetic layer is more magnetically isotropic than the reference ferromagnetic layer, or the reference ferromagnetic layer is more magnetically anisotropic than the free ferromagnetic layer.

Example A11 includes the apparatus of example A10 and/or some other example(s) herein, wherein the SOT tuned MTJ device further comprises: positive and negative bias terminals coupled to the SOC layer, wherein a current that flows between the positive and negative bias terminals is to bias the free ferromagnetic layer according to a mean of the probability distribution; a first voltage input terminal coupled to the free ferromagnetic layer; and a second voltage input terminal coupled to the reference ferromagnetic layer, wherein a magnetoresistance is created between the positive voltage input terminal and the negative voltage input terminal based on the bias of the free ferromagnetic layer, and the probabilistic resistance value is based on the magnetoresistance.

Example A12 includes the apparatus of examples A01-A09 and/or some other example(s) herein, wherein the time-varying resistance device is a ferroelectric gate tuned field effect transistor (FEFET) comprising: a substrate including a source region, a drain region, and a channel region between the source region and the drain region; a dielectric layer formed on the channel region of the substrate; a ferroelectric (FE) layer formed on the dielectric layer; and a top electrode (TE) layer formed on the FE layer.

Example A13 includes the apparatus of example A12 and/or some other example(s) herein, wherein the FEFET further comprises: a bias terminal coupled to the TE layer, wherein a bias signal to be applied to the bias terminal is to change an FE polarization of the FE layer; a first voltage input terminal coupled to the source region; and a second voltage input terminal coupled to the drain region, wherein a channel resistance is created in the channel region based on the bias of the FE polarization, and the probabilistic resistance value is based on the channel resistance.

Example A14 includes the apparatus of examples A01-A09 and/or some other example(s) herein, wherein the time-varying resistance device comprises random number generator (RNG) circuitry comprising: a set of digital p-bits, wherein each digital p-bit in the set of p-bits is to generate respective digital bits; p-bit interface circuitry connected to the set of digital p-bits, wherein the p-bit interface circuitry is to apply respective bias values to each digital p-bit of the set of digital p-bits; a resistance bank connected to the set of digital p-bits and connected to one or more p-bits of the plurality of p-bits, wherein the resistance bank is configured to determine, based on the respective digital bits, the probabilistic resistance value of the one or more p-bits to which the resistance bank is connected.

Example A15 includes the apparatus of examples A01-A14 and/or some other example(s) herein, wherein the stochastic neural network is one or more of a Bayesian network (BN), a Bayesian belief network (BBN), a Bayesian neural network (BNN), a deep BNN (DBNN), a dynamic BN (DBN), a probabilistic graphical model (PGM), a Boltzmann machine, a restricted Boltzmann machine (RBM), a Hopfield network, and a convolutional deep belief network (CDBN).

Example B01 includes a method of probabilistic in-memory computing of a stochastic neural network (SNN) by a probabilistic in-memory computing apparatus, the apparatus comprising a plurality of input lines, a plurality of accumulation lines intersecting the plurality of input lines; and a plurality of probabilistic bit devices (p-bits) each of which is coupled to an individual input line of the plurality of input lines and an individual accumulation line of the plurality of accumulation lines, wherein each p-bit is a time-varying resistance device having a probabilistic resistance value based on a probability distribution of the SNN, the method comprising: applying respective input voltages to respective input lines of the plurality of input lines such that the respective input voltages are multiplied by conductances of respective sets of p-bits of the plurality of p-bits connected to the respective input lines, and is to cause current to flow through respective accumulation lines to which the respective sets of p-bits are connected, and the current flowing through the respective accumulation lines is to accumulate with current at respective intersection points of the subsequent input lines of the plurality of input lines and the respective accumulation lines.

Example B02 includes the method of example B01 and/or some other example(s) herein, wherein accumulation of current along each accumulation line of the plurality of accumulation lines is a respective multiply-and-accumulate (MAC) operation.

Example B03 includes the method of examples B01-B02 and/or some other example(s) herein, wherein the probabilistic resistance value of individual p-bits of the plurality of p-bits is an element of a weight matrix of the SNN, and the weight matrix comprises weights for one layer of the SNN.

Example B04 includes the method of examples B01-B03 and/or some other example(s) herein, wherein the time-varying resistance device is a spin-orbit torque (SOT) tuned magnetic tunnel junction (MTJ) device comprising a spin-orbital coupling (SOC) layer; a top barrier layer disposed on the SOC layer; a free ferromagnetic layer disposed on the top barrier layer; a tunneling barrier layer disposed on the free ferromagnetic layer; a reference ferromagnetic layer disposed on the tunneling barrier layer, wherein the free ferromagnetic layer is more magnetically isotropic than the reference ferromagnetic layer, or the reference ferromagnetic layer is more magnetically anisotropic than the free ferromagnetic layer; positive and negative bias terminals coupled to the SOC layer; a first voltage input terminal coupled to the free ferromagnetic layer; and a second voltage input terminal coupled to the reference ferromagnetic layer, and wherein the method further comprises: applying a current to the positive or the negative bias terminals, wherein: the applied current flows between the positive and negative bias terminals to bias the free ferromagnetic layer according to a mean of the probability distribution, and a magnetoresistance is created between the positive voltage input terminal and the negative voltage input terminal based on the bias of the free ferromagnetic layer, and the probabilistic resistance value is based on the magnetoresistance.

Example B05 includes the method of examples B01-B03 and/or some other example(s) herein, wherein the time-varying resistance device is a ferroelectric gate tuned field effect transistor (FEFET) comprising a substrate including a source region, a drain region, and a channel region between the source region and the drain region; a dielectric layer formed on the channel region of the substrate; a ferroelectric (FE) layer formed on the dielectric layer; a top electrode (TE) layer formed on the FE layer; a bias terminal coupled to the TE layer; a first voltage input terminal coupled to the source region; and a second voltage input terminal coupled to the drain region, and wherein the method further comprises: applying a bias signal to the bias terminal to change an FE polarization of the FE layer, wherein a channel resistance is created in the channel region based on the bias of the FE polarization, and the probabilistic resistance value is based on the channel resistance.

Example B06 includes the method of examples B01-B03 and/or some other example(s) herein, wherein the time-varying resistance device comprises random number generator (RNG) circuitry comprising a set of digital p-bits, p-bit interface circuitry connected to the set of digital p-bits, and a resistance bank connected to the set of digital p-bits and connected to one or more p-bits of the plurality of p-bits, and wherein the method further comprises: operating the p-bit interface circuitry is to apply respective bias values to each digital p-bit of the set of digital p-bits; operating each digital p-bit in the set of p-bits to generate respective digital bits based on the respective bias values; and operating the resistance bank to determine, based on the respective digital bits, the probabilistic resistance value of the one or more p-bits to which the resistance bank is connected.

Example C01 includes a probabilistic in-memory computing system, comprising: a plurality of p-bit arrays, wherein each p-bit array of the plurality of p-bit arrays is connected to at least one other p-bit array of the plurality of p-bit arrays, and each p-bit array comprises: a plurality of input lines configured to receive respective input voltages, a plurality of accumulation lines intersecting the plurality of input lines, and a plurality of probabilistic bit devices (p-bits), each p-bit of the plurality of p-bits is coupled to an input line of the plurality of input lines and an accumulation line of the plurality of accumulation lines, and wherein each p-bit is a time-varying resistance device having a probabilistic resistance value based on a probability distribution of the SNN; and processor circuitry communicatively coupled to the plurality of p-bit arrays to provide data for modulation of the respective input voltages, wherein the respective input voltages to be applied to the individual input lines of the plurality of input lines is to cause current to flow through p-bits of the plurality of p-bits connected to the individual input lines and is accumulated on corresponding accumulation lines of the plurality of accumulation lines.

Example C02 includes the system of example C01 and/or some other example(s) herein, wherein the plurality of p-bits of each p-bit array is a same type of p-bit as each other p-bit of the plurality of p-bits.

Example C03 includes the system of example C01 and/or some other example(s) herein, wherein at least one p-bit in at least one p-bit array of the plurality of p-bit arrays is a different type of p-bit than other p-bits in the at least one p-bit array.

Example C04 includes the system of example C01, wherein p-bits in at least one p-bit array of the plurality of p-bit arrays are different type of p-bits than p-bits in at least one other p-bit array of the plurality of p-bit arrays.

Example C05 includes the system of examples C01-C04 and/or some other example(s) herein, wherein the plurality of p-bits includes one or more of spin-orbit torque (SOT) tuned magnetic tunnel junction (MTJ) devices, ferroelectric gate tuned field effect transistors (FEFETs), and random number generator (RNG) circuitry.

Example X01 includes the system of examples A01-A15, B01-B06, C01-C05 and/or some other example(s) herein, wherein the system is a central processing unit (CPU), graphics processing unit (GPU), vision processing unit (VPU), tensor processing unit (TPU), Neural Compute Engine (NCE), Neural Network Processor (NNP), a Vision Processing Unit (VPU), or a hardware accelerator.

Example Z01 includes one or more computer readable media comprising instructions, wherein execution of the instructions by processor circuitry is to cause the processor circuitry to perform the method of any one of examples A01-A15, B01-B06, C01-C05 and/or some other example(s) herein.

Example Z02 includes a computer program comprising the instructions of example Z01.

Example Z03a includes an Application Programming Interface defining functions, methods, variables, data structures, and/or protocols for the computer program of example Z02.

Example Z03b includes an API or specification defining functions, methods, variables, data structures, protocols, etc., defining or involving use of any of examples A01-A15, B01-B06, C01-C05 or portions thereof, or otherwise related to any of examples A01-A15, B01-B06, C01-C05 or portions thereof.

Example Z04 includes an apparatus comprising circuitry loaded with the instructions of example Z01.

Example Z05 includes an apparatus comprising circuitry operable to run the instructions of example Z01.

Example Z06 includes an integrated circuit comprising one or more of the processor circuitry of example Z01 and the one or more computer readable media of example Z01.

Example Z07 includes a computing system comprising the one or more computer readable media and the processor circuitry of example Z01.

Example Z08 includes an apparatus comprising means for executing the instructions of example Z01.

Example Z09 includes a signal generated as a result of executing the instructions of example Z01.

Example Z10 includes a data unit generated as a result of executing the instructions of example Z01.

Example Z11 includes the data unit of example Z10 and/or some other example(s) herein, wherein the data unit is a datagram, network packet, data frame, data segment, a Protocol Data Unit (PDU), a Service Data Unit (SDU), a message, or a database object.

Example Z12 includes a signal encoded with the data unit of examples Z10 and/or Z11.

Example Z13 includes an electromagnetic signal carrying the instructions of example Z01.

Example Z14 includes any of examples Z01-Z13 and/or one or more other example(s) herein, wherein the computing system and/or the processor circuitry comprises one or more of a System-in-Package (SiP), Multi-Chip Package (MCP), a System-on-Chips (SoC), a digital signal processors (DSP), a field-programmable gate arrays (FPGA), an Application Specific Integrated Circuits (ASIC), a programmable logic devices (PLD), a Central Processing Unit (CPU), a Graphics Processing Unit (GPU), or the computing system and/or the processor circuitry comprises two or more of SiPs, MCPs, SoCs, DSPs, FPGAs, ASICs, PLDs, CPUs, GPUs interconnected with one another.

Example Z15 includes an apparatus comprising means for performing the method of any one of examples A01-A15, B01-B06, C01-C05 and/or some other example(s) herein.

Any of the above-described examples may be combined with any other example (or combination of examples), unless explicitly stated otherwise. Implementation of the preceding techniques may be accomplished through any number of specifications, configurations, or example deployments of hardware and software. It should be understood that the functional units or capabilities described in this specification may have been referred to or labeled as components or modules, in order to more particularly emphasize their implementation independence. Such components may be embodied by any number of software or hardware forms. For example, a component or module may be implemented as a hardware circuit comprising custom very-large-scale integration (VLSI) circuits or gate arrays, off-the-shelf semiconductors such as logic chips, transistors, or other discrete components. A component or module may also be implemented in programmable hardware devices such as field programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together, but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center), than that in which the code is deployed (e.g., in a computer embedded in a sensor or robot). Similarly, operational data may be identified and illustrated herein within components or modules, and may be embodied in any suitable form and organized within any suitable type of data structure. The operational data may be collected as a single data set, or may be distributed over different locations including over different storage devices, and may exist, at least partially, merely as electronic signals on a system or network. The components or modules may be passive or active, including agents operable to perform desired functions.

5. Terminology

In the preceding detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

As used herein, the singular forms "a," "an" and "the" are intended to include plural forms as well, unless the context clearly indicates otherwise. It will be further understood that the terms "comprises" and/or "comprising," when used in this specification, specific the presence of stated features, integers, steps, operations, elements, and/or components, but do not preclude the presence or addition of one or more other features, integers, steps, operation, elements, components, and/or groups thereof. The phrase "A and/or B" means (A), (B), or (A and B). For the purposes of the present disclosure, the phrase "A, B, and/or C" means (A), (B), (C), (A and B), (A and C), (B and C), or (A, B and C). The description may use the phrases "in an embodiment," or "In some embodiments," which may each refer to one or more of the same or different embodiments. Furthermore, the terms "comprising," "including," "having," and the like, as used with respect to embodiments of the present disclosure, are synonymous.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or ink, and/or the like.

The term "obtain" at least in some embodiments refers to (partial or in full) acts, tasks, operations, etc., of intercepting, movement, copying, retrieval, or acquisition (e.g., from a memory, an interface, or a buffer), on the original packet stream or on a copy (e.g., a new instance) of the packet stream. Other aspects of obtaining or receiving may involving instantiating, enabling, or controlling the ability to obtain or receive the stream of packets (or the following parameters and templates or template values).

The term "measurement" at least in some embodiments refers to the observation and/or quantification of attributes of an object, event, or phenomenon.

The term "signal" at least in some embodiments refers to an observable change in a quality and/or quantity. Additionally or alternatively, the term "signal" at least in some embodiments refers to a function that conveys information about of an object, event, or phenomenon. Additionally or alternatively, the term "signal" at least in some embodiments refers to any time varying voltage, current, or electromagnetic wave that may or may not carry information. The term "digital signal" at least in some embodiments refers to a signal that is constructed from a discrete set of waveforms of a physical quantity so as to represent a sequence of discrete values.

The term "circuitry" at least in some embodiments refers to a circuit or system of multiple circuits configured to perform a particular function in an electronic device. The circuit or system of circuits may be part of, or include one or more hardware components, such as a logic circuit, a processor (shared, dedicated, or group) and/or memory (shared, dedicated, or group), an ASIC, a FPGA, programmable logic controller (PLC), SoC, SiP, multi-chip package (MCP), DSP, etc., that are configured to provide the described functionality. In addition, the term "circuitry" may also refer to a combination of one or more hardware elements with the program code used to carry out the functionality of that program code. Some types of circuitry may execute one or more software or firmware programs to provide at least some of the described functionality. Such a combination of hardware elements and program code may be referred to as a particular type of circuitry.

It should be understood that the functional units or capabilities described in this specification may have been referred to or labeled as components or modules, in order to more particularly emphasize their implementation independence. Such components may be embodied by any number of software or hardware forms. For example, a component or module may be implemented as a hardware circuit comprising custom very-large-scale integration (VLSI) circuits or gate arrays, off-the-shelf semiconductors such as logic chips, transistors, or other discrete components. A component or module may also be implemented in programmable hardware devices such as field programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center) than that in which the code is deployed (e.g., in a computer embedded in a sensor or robot). Similarly, operational data may be identified and illustrated herein within components or modules and may be embodied in any suitable form and organized within any suitable type of data structure. The operational data may be collected as a single data set or may be distributed over different locations including over different storage devices, and may exist, at least partially, merely as electronic signals on a system or network. The components or modules may be passive or active, including agents operable to perform desired functions.

The term "processor circuitry" at least in some embodiments refers to, is part of, or includes circuitry capable of sequentially and automatically carrying out a sequence of arithmetic or logical operations, or recording, storing, and/or transferring digital data. The term "processor circuitry" at least in some embodiments refers to one or more application processors, one or more baseband processors, a physical CPU, a single-core processor, a dual-core processor, a triple-core processor, a quad-core processor, and/or any other device capable of executing or otherwise operating computer-executable instructions, such as program code, software modules, and/or functional processes. The terms "application circuitry" and/or "baseband circuitry" may be considered synonymous to, and may be referred to as, "processor circuitry."

The term "memory" and/or "memory circuitry" at least in some embodiments refers to one or more hardware devices for storing data, including RAM, MRAM, PRAM, DRAM, and/or SDRAM, core memory, ROM, magnetic disk storage mediums, optical storage mediums, flash memory devices or other machine readable mediums for storing data. The term "computer-readable medium" may include, but is not limited to, memory, portable or fixed storage devices, optical storage devices, and various other mediums capable of storing, containing or carrying instructions or data.

The term "interface circuitry" at least in some embodiments refers to, is part of, or includes circuitry that enables the exchange of information between two or more components or devices. The term "interface circuitry" at least in some embodiments refers to one or more hardware interfaces, for example, buses, I/O interfaces, peripheral component interfaces, network interface cards, and/or the like.

The term "device" at least in some embodiments refers to a physical entity embedded inside, or attached to, another physical entity in its vicinity, with capabilities to convey digital information from or to that physical entity.

The term "entity" at least in some embodiments refers to a distinct component of an architecture or device, or information transferred as a payload.

The term "controller" at least in some embodiments refers to an element or entity that has the capability to affect a physical entity, such as by changing its state or causing the physical entity to move.

The term "compute node" or "compute device" at least in some embodiments refers to an identifiable entity implementing an aspect of computing operations, whether part of a larger system, distributed collection of systems, or a standalone apparatus. In some examples, a compute node may be referred to as a "computing device", "computing system", or the like, whether in operation as a client, server, or intermediate entity. Specific implementations of a compute node may be incorporated into a server, base station, gateway, road side unit, on-premise unit, user equipment, end consuming device, appliance, or the like.

The term "computer system" at least in some embodiments refers to any type interconnected electronic devices, computer devices, or components thereof. Additionally, the terms "computer system" and/or "system" at least in some embodiments refer to various components of a computer that are communicatively coupled with one another. Furthermore, the term "computer system" and/or "system" at least in some embodiments refer to multiple computer devices and/or multiple computing systems that are communicatively coupled with one another and configured to share computing and/or networking resources.

The term "in-memory computing", "in-memory computation", or "in-memory processing" at least in some embodiments refers to a technique in which calculations are performed mostly or entirely in system memory (e.g., random access memory (RAM)) and/or where data is stored in system memory (e.g., RAM) rather than in a database or storage device. Additionally or alternatively, the term "in-memory computing", "in-memory computation", or "in-memory processing" at least in some embodiments refers to data processing using an in-memory database. The term "in-memory database" at least in some embodiments refers to a database management system that relies mostly or primarily on main memory or system memory for data storage.

The term "terminal" at least in some embodiments refers to point at which a conductor from a component, device, or network comes to an end. Additionally or alternatively, the term "terminal" at least in some embodiments refers to an electrical connector acting as an interface to a conductor and creating a point where external circuits can be connected. In some embodiments, terminals may include electrical leads, electrical connectors, electrical connectors, solder cups or buckets, and/or the like.

The term "fabrication" at least in some embodiments refers to the creation of a metal structure using fabrication means. The term "fabrication means" as used herein refers to any suitable tool or machine that is used during a fabrication process and may involve tools or machines for cutting (e.g., using manual or powered saws, shears, chisels, routers, torches including handheld torches such as oxy-fuel torches or plasma torches, and/or computer numerical control (CNC) cutters including lasers, mill bits, torches, water jets, routers, etc.), bending (e.g., manual, powered, or CNC hammers, pan brakes, press brakes, tube benders, roll benders, specialized machine presses, etc.), assembling (e.g., by welding, soldering, brazing, crimping, coupling with adhesives, riveting, using fasteners, etc.), molding or casting (e.g., die casting, centrifugal casting, injection molding, extrusion molding, matrix molding, three-dimensional (3D) printing techniques including fused deposition modeling, selective laser melting, selective laser sintering, composite filament fabrication, fused filament fabrication, stereolithography, directed energy deposition, electron beam freeform fabrication, etc.), and PCB and/or semiconductor manufacturing techniques (e.g., silk-screen printing, photolithography, photoengraving, PCB milling, laser resist ablation, laser etching, plasma exposure, atomic layer deposition (ALD), molecular layer deposition (MLD), chemical vapor deposition (CVD), rapid thermal processing (RTP), and/or the like).

The term "etch" or "etching" at least in some embodiments refers to a process in which a controlled quantity or thickness of material is removed (often selectively) from a surface by chemical reaction, electrolysis, or other means.

The term "plasma etching" at least in some embodiments refers to a process in which material is removed by a reaction with chemically active radicals created by an ion bombardment in a glow discharge. In some cases, a mask is usually used in order to remove only selected areas.

The term "mask" at least in some embodiments refers to a patterned screen of any of several materials and types used in shielding selected areas of a semiconductor, photosensitive layer, or substrate from radiation during processing, so that the unshielded areas can be further processed to reproduce the chosen pattern. The type of mask can be designated either by type (e.g., oxide mask or metal mask) or by function (e.g., diffusion mask or vapor-deposition mask).

The term "fastener", "fastening means", or the like at least in some embodiments refers to a device that mechanically joins or affixes two or more objects together, and may include threaded fasteners (e.g., bolts, screws, nuts, threaded rods, etc.), pins, linchpins, r-clips, clips, pegs, clamps, dowels, cam locks, latches, catches, ties, hooks, magnets, molded or assembled joineries, and/or the like.

The terms "flexible," "flexibility," and/or "pliability" at least in some embodiments refer to the ability of an object or material to bend or deform in response to an applied force; "the term "flexible" is complementary to "stiffness." The term "stiffness" and/or "rigidity" refers to the ability of an object to resist deformation in response to an applied force. The term "elasticity" refers to the ability of an object or material to resist a distorting influence or stress and to return to its original size and shape when the stress is removed. Elastic modulus (a measure of elasticity) is a property of a material, whereas flexibility or stiffness is a property of a structure or component of a structure and is dependent upon various physical dimensions that describe that structure or component.

The term "wear" at least in some embodiments refers to the phenomenon of the gradual removal, damaging, and/or displacement of material at solid surfaces due to mechanical processes (e.g., erosion) and/or chemical processes (e.g., corrosion). Wear causes functional surfaces to degrade, eventually leading to material failure or loss of functionality. The term "wear" at least in some embodiments also includes other processes such as fatigue (e.g., the weakening of a material caused by cyclic loading that results in progressive and localized structural damage and the growth of cracks) and creep (e.g., the tendency of a solid material to move slowly or deform permanently under the influence of persistent mechanical stresses). Mechanical wear may occur as a result of relative motion occurring between two contact surfaces. Wear that occurs in machinery components has the potential to cause degradation of the functional surface and ultimately loss of functionality. Various factors, such as the type of loading, type of motion, temperature, lubrication, and the like may affect the rate of wear.

The term "lateral" at least in some embodiments refers to directions or positions relative to an object spanning the width of a body of the object, relating to the sides of the object, and/or moving in a sideways direction with respect to the object.

The term "longitudinal" at least in some embodiments refers to directions or positions relative to an object spanning the length of a body of the object; relating to the top or bottom of the object, and/or moving in an upwards and/or downwards direction with respect to the object.

The term "linear" at least in some embodiments refers to directions or positions relative to an object following a straight line with respect to the object, and/or refers to a movement or force that occurs in a straight line rather than in a curve.

The term "lineal" at least in some embodiments refers to directions or positions relative to an object following along a given path with respect to the object, wherein the shape of the path is straight or not straight.

The term "normal" or "normal axis" at least in some embodiments refers to a line, ray, or vector that is perpendicular to a given object.

The term "mechanical axis" at least in some embodiments refers to an axis that passes through the physical center of an optical element and/or is perpendicular to the outside edges of the optical element.

The term "curvature" at least in some embodiments refers to a rate of change of direction of a curve with respect to distance along the curve.

The term "magnetization" at least in some embodiments refers to a vector field that expresses the density of permanent or induced magnetic dipole moments in a magnetic material.

The term "substrate" at least in some embodiments refers to a supporting material upon which, or within which, the elements of a semiconductor device are fabricated or attached. Additionally or alternatively, the term "substrate of a film integrated circuit" at least in some embodiments refers to a piece of material forming a supporting base for film circuit elements and possibly additional components. Additionally or alternatively, the term "substrate of a flip chip die" at least in some embodiments refers to a supporting material upon which one or more semiconductor flip chip die are attached. Additionally or alternatively, the term "original substrate" at least in some embodiments refers to an original semiconductor material being processed. The original material may be a layer of semiconductor material cut from a single crystal, a layer of semiconductor material deposited on a supporting base, or the supporting base itself. Additionally or alternatively, the term "remaining substrate" at least in some embodiments refers to the part of the original material that remains essentially unchanged when the device elements are formed upon or within the original material.

The term "wafer" at least in some embodiments refers to a slice or flat disk, either of semiconductor material or of such a material deposited on a substrate, in which circuits or devices are simultaneously processed and subsequently separated into chips if there is more than one device. Additionally or alternatively, the term "wafer-level package" at least in some embodiments refers to a package whose size is generally equal to the size of the semiconductor device it contains and that is formed by processing on a complete wafer rather than on an individual device. In some cases, because of the wafer-level processing, the size of a wafer-level package may be defined by finer dimensions and tighter tolerances than those for a similar non-wafer-level package. Furthermore, the package size may change with changes in the size of the die.

The term "in situ", in the context of semiconductor fabrication and processing, at least in some embodiments refers a technique in which several processes are carried out in sequence without exposing a wafer to air between the process steps. These processes can be combinations of different deposition and/or annealing processes such as rapid thermal processing (RTP), oxidation, chemical vapor deposition (CVD), atomic layer deposition (ALD), molecular layer deposition (MLD), surface cleaning, rapid thermal oxidation, nitridation, polysilicon deposition, and the like. The term "in-situ scanning tunneling microscopy" or "STM" at least in some embodiments refers to a high-resolution technique for studying the structural and electronic properties of surfaces in coordinate space with atomic resolution directly under ultra-high vacuum (UHV) conditions, preserving the fabricated structures from oxidation and contamination.

The term "antiferromagnetism" at least in some embodiments refers to the magnetic moments of atoms, molecules, and/or the spins of electrons that align in a regular pattern with neighboring spins on different sublattices pointing in opposite directions.

The term "anisotropy" at least in some embodiments refers to the property of a material which allows it to change or assume different properties in different directions, and can be defined as a difference, when measured along different axes, and/or in a material's physical or mechanical properties (e.g., absorbance, refractive indexm conductivity, magnetization, tensile strength, etc.).

The term "isotropy" at least in some embodiments refers a material that has identical or uniform properties in all directions, and can be defined or measured along different axes and/or in a material's physical or mechanical properties (e.g., absorbance, refractive indexm conductivity, magnetization, tensile strength, etc.).

The term "magnetic anisotropy" or "anisotropy" at least in some embodiments refers to a material or object having magnetic properties that can be different depending on direction, wherein magnetically anisotropic materials will be easier or harder to magnetize depending on which way the object is rotated. The term "magnetic isotropy" or "isotropy" at least in some embodiments refers to a material or object having magnetic properties that have no preferential direction for that material/object's magnetic moment and will respond to an applied magnetic field in the same way, regardless of which direction the field is applied.

The term "magnetoresistance" at least in some embodiments refers to the tendency of a material (e.g., a ferromagnetic material) to change the value of its electrical resistance in an externally-applied magnetic field.

The term "spin" at least in some embodiments refers to an intrinsic form of angular momentum carried by elementary particles. Additionally or alternatively, the term "spin" at least in some embodiments refers to an intrinsic magnetic moment of elementary particles, such as electrons.

The term "spin Hall effect" at least in some embodiments refers to the Hall effect for spin, wherein there is an accumulation of particles with opposite spins on the opposite surfaces of a material in which a current is flowing.

The term "spin magnetic moment" at least in some embodiments refers to magnetic moment caused by the spin of elementary particles.

The term "spin-orbit coupling" at least in some embodiments refers to an interaction between the orbital angular momentum and the spin angular momentum of an individual particle, such as an electron.

The term "spin-orbit torque" at least in some embodiments refers to a phenomenon in which an electrical current flowing through a bilayer including a heavy metal and a ferromagnet can give a jolt to the magnetization in the ferromagnet. Additionally or alternatively, the term "spin-orbit torque" at least in some embodiments refers to a phenomenon in which an electrical current generates spin-polarized electrons due to the spin Hall effect thereby changing the magnetic properties of a material. Additionally or alternatively, the term "spin-orbit torque" at least in some embodiments refers to the dependence of magnetic properties of a magnetic material on the polarity and magnitude of an electrical current.

The term "accuracy" at least in some embodiments refers to the closeness of one or more measurements to a specific value.

The term "artificial intelligence" or "AI" at least in some embodiments refers to any intelligence demonstrated by machines, in contrast to the natural intelligence displayed by humans and other animals. Additionally or alternatively, the term "artificial intelligence" or "AI" at least in some embodiments refers to the study of "intelligent agents" and/or any device that perceives its environment and takes actions that maximize its chance of successfully achieving a goal.

The terms "artificial neural network", "neural network", or "NN" refer to an ML technique comprising a collection of connected artificial neurons or nodes that (loosely) model neurons in a biological brain that can transmit signals to other arterial neurons or nodes, where connections (or edges) between the artificial neurons or nodes are (loosely) modeled on synapses of a biological brain. The artificial neurons and edges typically have a weight that adjusts as learning proceeds. The weight increases or decreases the strength of the signal at a connection. Neurons may have a threshold such that a signal is sent only if the aggregate signal crosses that threshold. The artificial neurons can be aggregated or grouped into one or more layers where different layers may perform different transformations on their inputs. Signals travel from the first layer (the input layer), to the last layer (the output layer), possibly after traversing the layers multiple times. NNs are usually used for supervised learning, but can be used for unsupervised learning as well. Examples of NNs include deep NN (DNN), feed forward NN (FFN), deep FNN (DFF), convolutional NN (CNN), deep CNN (DCN), deconvolutional NN (DNN), a deep belief NN, a perception NN, recurrent NN (RNN) (e.g., including Long Short Term Memory (LSTM) algorithm, gated recurrent unit (GRU), echo state network (ESN), etc.), spiking NN (SNN), deep stacking network (DSN), Markov chain, perception NN, generative adversarial network (GAN), transformers, stochastic NNs (e.g., Bayesian Network (BN), Bayesian belief network (BBN), a Bayesian NN (BNN), Deep BNN (DBNN), Dynamic BN (DBN), probabilistic graphical model (PGM), Boltzmann machine, restricted Boltzmann machine (RBM), Hopfield network or Hopfield NN, convolutional deep belief network (CDBN), etc.), Linear Dynamical System (LDS), Switching LDS (SLDS), Optical NNs (ONNs), an NN for reinforcement learning (RL) and/or deep RL (DRL), and/or the like.

The term "backpropagation" at least in some embodiments refers to a method used in NNs to calculate a gradient that is needed in the calculation of weights to be used in the NN; "backpropagation" is shorthand for "the backward propagation of errors." Additionally or alternatively, the term "backpropagation" at least in some embodiments refers to a method of calculating the gradient of neural network parameters. Additionally or alternatively, the term "backpropagation" or "back pass" at least in some embodiments refers to a method of traversing a neural network in reverse order, from the output to the input layer.

The term "forward propagation" or "forward pass" at least in some embodiments, in the context of ML, refers to the calculation and storage of intermediate variables (including outputs) for a neural network in order from the input layer to the output layer.

The term "hidden layer", in the context of ML and NNs, at least in some embodiments refers to an internal layer of neurons in an ANN that is not dedicated to input or output. The term "hidden unit" refers to a neuron in a hidden layer in an ANN.

The term "matrix" at least in some embodiments refers to a rectangular array of numbers, symbols, or expressions, arranged in rows and columns, which may be used to represent an object or a property of such an object.

The term "machine learning" or "ML" at least in some embodiments refers to the use of computer systems to optimize a performance criterion using example (training) data and/or past experience. ML involves using algorithms to perform specific task(s) without using explicit instructions to perform the specific task(s), and/or relying on patterns, predictions, and/or inferences. ML uses statistics to build mathematical model(s) (also referred to as "ML models" or simply "models") in order to make predictions or decisions based on sample data (e.g., training data). The model is defined to have a set of parameters, and learning is the execution of a computer program to optimize the parameters of the model using the training data or past experience. The trained model may be a predictive model that makes predictions based on an input dataset, a descriptive model that gains knowledge from an input dataset, or both predictive and descriptive. Once the model is learned (trained), it can be used to make inferences (e.g., predictions). ML algorithms perform a training process on a training dataset to estimate an underlying ML model. An ML algorithm is a computer program that learns from experience with respect to some task(s) and some performance measure(s)/metric(s), and an ML model is an object or data structure created after an ML algorithm is trained with training data. In other words, the term "ML model" or "model" may describe the output of an ML algorithm that is trained with training data. After training, an ML model may be used to make predictions on new datasets. Additionally, separately trained AI/ML models can be chained together in a AI/ML pipeline during inference or prediction generation. Although the term "ML algorithm at least in some embodiments refers to different concepts than the term "ML model," these terms may be used interchangeably for the purposes of the present disclosure. Furthermore, the term "AI/ML application" or the like at least in some embodiments refers to an application that contains some AI/ML models and application-level descriptions. ML techniques generally fall into the following main types of learning problem categories: supervised learning, unsupervised learning, and reinforcement learning.

The term "optimization" at least in some embodiments refers to an act, process, or methodology of making something (e.g., a design, system, or decision) as fully perfect, functional, or effective as possible. Optimization usually includes mathematical procedures such as finding the maximum or minimum of a function. The term "optimal" at least in some embodiments refers to a most desirable or satisfactory end, outcome, or output. The term "optimum" at least in some embodiments refers to an amount or degree of something that is most favorable to some end. The term "optima" at least in some embodiments refers to a condition, degree, amount, or compromise that produces a best possible result. Additionally or alternatively, the term "optima" at least in some embodiments refers to a most favorable or advantageous outcome or result.

The term "probability" at least in some embodiments refers to a numerical description of how likely an event is to occur and/or how likely it is that a proposition is true.

The term "probability distribution" at least in some embodiments refers to a function that gives the probabilities of occurrence of different possible outcomes for an experiment or event. Additionally or alternatively, the term "probability distribution" at least in some embodiments refers to a statistical function that describes all possible values and likelihoods that a random variable can take within a given range (e.g., a bound between minimum and maximum possible values). A probability distribution may have one or more factors or attributes such as, for example, a mean or average, mode, support, tail, head, median, variance, standard deviation, quantile, symmetry, skewness, kurtosis, etc. A probability distribution may be a description of a random phenomenon in terms of a sample space and the probabilities of events (subsets of the sample space). Example probability distributions include discrete distributions (e.g., Bernoulli distribution, discrete uniform, binomial, Dirac measure, Gauss-Kuzmin distribution, geometric, hypergeometric, negative binomial, negative hypergeometric, Poisson, Poisson binomial, Rademacher distribution, Yule-Simon distribution, zeta distribution, Zipf distribution, etc.), continuous distributions (e.g., Bates distribution, beta, continuous uniform, normal distribution, Gaussian distribution, bell curve, joint normal, gamma, chi-squared, non-central chi-squared, exponential, Cauchy, lognormal, logit-normal, F distribution, t distribution, Dirac delta function, Pareto distribution, Lomax distribution, Wishart distribution, Weibull distribution, Gumbel distribution, Irwin-Hall distribution, Gompertz distribution, inverse Gaussian distribution (or Wald distribution), Chernoff's distribution, Laplace distribution, Pólya-Gamma distribution, etc.), and/or joint distributions (e.g., Dirichlet distribution, Ewens's sampling formula, multinomial distribution, multivariate normal distribution, multivariate t-distribution, Wishart distribution, matrix normal distribution, matrix t distribution, etc.).

The term "probability distribution function" at least in some embodiments refers to an integral of the probability density function.

The term "probability density function" or "PDF" at least in some embodiments refers to a function whose value at any given sample (or point) in a sample space can be interpreted as providing a relative likelihood that the value of the random variable would be close to that sample. Additionally or alternatively, the term "probability density function" or "PDF" at least in some embodiments refers to a probability of a random variable falling within a particular range of values. Additionally or alternatively, the term "probability density function" or "PDF" at least in some embodiments refers to a value at two different samples can be used to infer, in any particular draw of the random variable, how much more likely it is that the random variable would be close to one sample compared to the other sample.

The term "precision" at least in some embodiments refers to the closeness of the two or more measurements to each other. The term "precision" may also be referred to as "positive predictive value".

The term "standard deviation" at least in some embodiments refers to a measure of the amount of variation or dispersion of a set of values. Additionally or alternatively, the term "standard deviation" at least in some embodiments refers to the square root of a variance of a random variable, a sample, a statistical population, a dataset, or a probability distribution.

The term "stochastic" at least in some embodiments refers to a property of being described by a random probability distribution. Although the terms "stochasticity" and "randomness" are distinct in that the former refers to a modeling approach and the latter refers to phenomena themselves, for purposes of the present disclosure these two terms may be used synonymously unless the context indicates otherwise.

The term "tensor" at least in some embodiments refers to an object or other data structure represented by an array of components that describe functions relevant to coordinates of a space. Additionally or alternatively, the term "tensor" at least in some embodiments refers to a generalization of vectors and matrices and/or may be understood to be a multidimensional array. Additionally or alternatively, the term "tensor" at least in some embodiments refers to an array of numbers arranged on a regular grid with a variable number of axes. At least in some embodiments, a tensor can be defined as a single point, a collection of isolated points, or a continuum of points in which elements of the tensor are functions of position, and the Tensor forms a "tensor field". At least in some embodiments, a vector may be considered as a one dimensional (1D) or first order tensor, and a matrix may be considered as a two dimensional (2D) or second order tensor. Tensor notation may be the same or similar as matrix notation with a capital letter representing the tensor and lowercase letters with subscript integers representing scalar values within the tensor.

The term "vector" at least in some embodiments refers to a one-dimensional array data structure. Additionally or alternatively, the term "vector" at least in some embodiments refers to a tuple of one or more values called scalars. The term terms "sparse vector", "sparse matrix", and "sparse array" at least in some embodiments refer to an input vector, matrix, or array including both non-zero elements and zero elements. The terms "ZVC data vector" "ZVC matrix", and "ZVC array" at least in some embodiments refer to a vector, matrix, or array that includes all non-zero elements of a vector, matrix, or array in the same order as a sparse vector, matrix, or array, but excludes all zero elements. The terms "dense vector", "dense matrix", and "dense array" at least in some embodiments refer to an input vector, matrix, or array including all non-zero elements.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

The invention claimed is:

1. A probabilistic in-memory computing apparatus for a stochastic neural network (SNN), the apparatus comprising:
   a plurality of input lines arranged parallel to one another;
   a plurality of accumulation lines arranged parallel to one another and intersecting the plurality of input lines; and
   a plurality of probabilistic bit devices (p-bits), wherein each p-bit of the plurality of p-bits is coupled to an input line of the plurality of input lines and an accumulation line of the plurality of accumulation lines, each p-bit is a time-varying resistance device that includes at least one bias terminal, the at least one bias terminal of each p-bit is capable of receiving a bias voltage, and the bias voltage is to cause a time-varying resistance of each p-bit to have a probabilistic resistance value based on a probability distribution of the SNN.

2. The apparatus of claim 1, wherein the plurality of input lines are arranged perpendicular to the plurality of accumulation lines in a lateral or longitudinal plane.

3. The apparatus of claim 2, wherein:
   each input line of the plurality of input lines is laterally separated from other input lines of the plurality of input lines,
   each accumulation line of the plurality of accumulation lines is laterally separated from other accumulation lines of the plurality of accumulation lines, and
   each input line is longitudinally separated from each accumulation line.

4. The apparatus of claim 2, wherein each p-bit includes a first terminal and a second terminal, wherein the first terminal of each p-bit is connected to a corresponding input line of the plurality of input lines and the second terminal of each p-bit is connected to a corresponding accumulation line of the plurality of accumulation lines.

5. The apparatus of claim 4, wherein the second terminal of each p-bit is connected to a portion of the corresponding accumulation line that precedes an intersection point between the corresponding accumulation line and another input line of the plurality of input lines to which another p-bit of the plurality of p-bits is connected.

6. The apparatus of claim 2, wherein:
   a first input voltage to be applied to a first input line of the plurality of input lines is multiplied by a conductance of a first set of p-bits of the plurality of p-bits connected to the first input line, and is to cause first current to flow through respective accumulation lines to which the first set of p-bits are connected,
   a second input voltage to be applied to a second input line of the plurality of input lines is multiplied by a conductance of a second set of p-bits of the plurality of p-bits connected to the second input line, and is to cause second current to flow through respective accumulation lines to which the second set of p-bits are connected, and
   the first current is to accumulate with the second current at respective intersection points of the second input line and the respective accumulation lines.

7. The apparatus of claim 1, wherein accumulation of current along each accumulation line of the plurality of accumulation lines is a respective multiply-and-accumulate (MAC) operation.

8. The apparatus of claim 1, further comprising:
   a plurality of analog-to-digital converters (ADCs), wherein each ADC of the plurality of ADCs is connected to a corresponding ADC of the plurality of accumulation lines, and each ADC is configured to convert accumulated current from the corresponding ADC into a respective digital signal.

9. The apparatus of claim 1, wherein the probabilistic resistance value of individual p-bits of the plurality of p-bits is an element of a weight matrix of the SNN, and the weight matrix comprises weights for one layer of the SNN.

10. The apparatus of claim 1, wherein the time-varying resistance device is a spin-orbit torque (SOT) tuned magnetic tunnel junction (MTJ) device comprising:
    a spin-orbital coupling (SOC) layer;
    a top barrier layer disposed on the SOC layer;
    a free ferromagnetic layer disposed on the top barrier layer;
    a tunneling barrier layer disposed on the free ferromagnetic layer; and
    a reference ferromagnetic layer disposed on the tunneling barrier layer, and
    wherein the free ferromagnetic layer is more magnetically isotropic than the reference ferromagnetic layer, or the reference ferromagnetic layer is more magnetically anisotropic than the free ferromagnetic layer.

11. The apparatus of claim 10, wherein the SOT tuned MTJ device further comprises:
    positive and negative bias terminals coupled to the SOC layer, wherein a current that flows between the positive and negative bias terminals is to bias the free ferromagnetic layer according to a mean of the probability distribution;
    a first voltage input terminal coupled to the free ferromagnetic layer; and
    a second voltage input terminal coupled to the reference ferromagnetic layer,
    wherein a magnetoresistance is created between the positive voltage input terminal and the negative voltage input terminal based on the bias of the free ferromagnetic layer, and the probabilistic resistance value is based on the magnetoresistance.

12. The apparatus of claim 1, wherein the time-varying resistance device is a ferroelectric gate tuned field effect transistor (FEFET) comprising:
    a substrate including a source region, a drain region, and a channel region between the source region and the drain region;
    a dielectric layer formed on the channel region of the substrate;
    a ferroelectric (FE) layer formed on the dielectric layer; and
    a top electrode (TE) layer formed on the FE layer.

13. The apparatus of claim 12, wherein the FEFET further comprises:
a bias terminal coupled to the TE layer, wherein a bias signal to be applied to the bias terminal is to change an FE polarization of the FE layer;
a first voltage input terminal coupled to the source region; and
a second voltage input terminal coupled to the drain region,
wherein a channel resistance is created in the channel region based on the bias of the FE polarization, and the probabilistic resistance value is based on the channel resistance.

14. The apparatus of claim 1, wherein the time-varying resistance device comprises random number generator (RNG) circuitry comprising:
a set of digital p-bits, wherein each digital p-bit in the set of p-bits is to generate respective digital bits;
p-bit interface circuitry connected to the set of digital p-bits, wherein the p-bit interface circuitry is to apply respective bias values to each digital p-bit of the set of digital p-bits;
a resistance bank connected to the set of digital p-bits and connected to one or more p-bits of the plurality of p-bits, wherein the resistance bank is configured to determine, based on the respective digital bits, the probabilistic resistance value of the one or more p-bits to which the resistance bank is connected.

15. The apparatus of claim 1, wherein the SNN is one or more of a Bayesian network (BN), a Bayesian belief network (BBN), a Bayesian neural network (BNN), a deep BNN (DBNN), a dynamic BN (DBN), a probabilistic graphical model (PGM), a Boltzmann machine, a restricted Boltzmann machine (RBM), a Hopfield network, and a convolutional deep belief network (CDBN).

16. A method of probabilistic in-memory computing of a stochastic neural network (SNN) by a probabilistic in-memory computing apparatus, the apparatus comprising a plurality of input lines, a plurality of accumulation lines intersecting the plurality of input lines; and a plurality of probabilistic bit devices (p-bits) each of which is coupled to an individual input line of the plurality of input lines and an individual accumulation line of the plurality of accumulation lines, wherein each p-bit includes at least one bias terminal capable of receiving a bias voltage, and the bias voltage applied to the at least one bias terminal of each p-bit is to cause a time-varying resistance of each p-bit to have a probabilistic resistance value based on a probability distribution of the SNN, the method comprising:
applying respective input voltages to respective input lines of the plurality of input lines such that:
the respective input voltages are multiplied by conductances of respective sets of p-bits of the plurality of p-bits connected to the respective input lines, and is to cause current to flow through respective accumulation lines to which the respective sets of p-bits are connected, and
the current flowing through the respective accumulation lines is to accumulate with current at respective intersection points of subsequent input lines of the plurality of input lines and the respective accumulation lines.

17. The method of claim 16, wherein accumulation of current along each accumulation line of the plurality of accumulation lines is a respective multiply-and-accumulate (MAC) operation.

18. The method of claim 16, wherein the probabilistic resistance value of individual p-bits of the plurality of p-bits is an element of a weight matrix of the SNN, and the weight matrix comprises weights for one layer of the SNN.

19. The method of claim 16, wherein the time-varying resistance device is a spin-orbit torque (SOT) tuned magnetic tunnel junction (MTJ) device comprising a spin-orbital coupling (SOC) layer; a top barrier layer disposed on the SOC layer; a free ferromagnetic layer disposed on the top barrier layer; a tunneling barrier layer disposed on the free ferromagnetic layer; a reference ferromagnetic layer disposed on the tunneling barrier layer, wherein the free ferromagnetic layer is more magnetically isotropic than the reference ferromagnetic layer, or the reference ferromagnetic layer is more magnetically anisotropic than the free ferromagnetic layer; positive and negative bias terminals are coupled to the SOC layer; a first voltage input terminal is coupled to the free ferromagnetic layer; and a second voltage input terminal is coupled to the reference ferromagnetic layer, and wherein the method further comprises:
applying a current to the positive or the negative bias terminals, wherein:
the applied current flows between the positive and negative bias terminals to bias the free ferromagnetic layer according to a mean of the probability distribution, and
a magnetoresistance is created between the positive voltage input terminal and the negative voltage input terminal based on the bias of the free ferromagnetic layer, and the probabilistic resistance value is based on the magnetoresistance.

20. The method of claim 16, wherein the time-varying resistance device is a ferroelectric gate tuned field effect transistor (FEFET) comprising a substrate including a source region, a drain region, and a channel region between the source region and the drain region; a dielectric layer formed on the channel region of the substrate; a ferroelectric (FE) layer formed on the dielectric layer; a top electrode (TE) layer formed on the FE layer; a bias terminal coupled to the TE layer; a first voltage input terminal coupled to the source region; and a second voltage input terminal coupled to the drain region, and wherein the method further comprises:
applying a bias signal to the bias terminal to change an FE polarization of the FE layer, wherein a channel resistance is created in the channel region based on the bias of the FE polarization, and the probabilistic resistance value is based on the channel resistance.

21. The method of claim 16, wherein the time-varying resistance device comprises random number generator (RNG) circuitry comprising a set of digital p-bits, p-bit interface circuitry connected to the set of digital p-bits, and a resistance bank connected to the set of digital p-bits and connected to one or more p-bits of the plurality of p-bits, and wherein the method further comprises:
operating the p-bit interface circuitry to apply respective bias values to each digital p-bit of the set of digital p-bits;
operating each digital p-bit in the set of p-bits to generate respective digital bits based on the respective bias values; and
operating the resistance bank to determine, based on the respective digital bits, the probabilistic resistance value of the one or more p-bits to which the resistance bank is connected.

22. A probabilistic in-memory computing system, comprising:
a plurality of p-bit arrays, wherein each p-bit array of the plurality of p-bit arrays is connected to at least one other p-bit array of the plurality of p-bit arrays, and each p-bit array comprises:
- a plurality of input lines configured to receive respective input voltages,
- a plurality of accumulation lines intersecting the plurality of input lines, and
- a plurality of probabilistic bit devices (p-bits), each p-bit of the plurality of p-bits includes a first terminal coupled to an input line of the plurality of input lines, a second terminal coupled to an accumulation line of the plurality of accumulation lines, and at least one bias terminal capable of receiving a bias voltage, wherein the bias voltage applied to the at least one bias terminal of each p-bit is to cause a time-varying resistance of each p-bit to have a probabilistic resistance value based on a probability distribution of a stochastic neural network (SNN); and processor circuitry communicatively coupled to the plurality of p-bit arrays to provide data for modulation of the respective input voltages, wherein the respective input voltages to be applied to individual input lines of the plurality of input lines is to cause current to flow through p-bits of the plurality of p-bits connected to the individual input lines and is accumulated on corresponding accumulation lines of the plurality of accumulation lines.

23. The system of claim 22, wherein the plurality of p-bits of each p-bit array is a same type of p-bit as each other p-bit of the plurality of p-bits.

24. The system of claim 22, wherein at least one p-bit in at least one p-bit array of the plurality of p-bit arrays is a different type of p-bit than other p-bits in the at least one p-bit array.

25. The system of claim 22, wherein p-bits in at least one p-bit array of the plurality of p-bit arrays are different type of p-bits than p-bits in at least one other p-bit array of the plurality of p-bit arrays.

26. The system of claim 22, wherein the plurality of p-bits includes one or more of spin-orbit torque (SOT) tuned magnetic tunnel junction (MTJ) devices, ferroelectric gate tuned field effect transistors (FEFETs), and random number generator (RNG) circuitry.

* * * * *

UNITED STATES PATENT AND TRADEMARK OFFICE
CERTIFICATE OF CORRECTION

PATENT NO. : 11,900,979 B2
APPLICATION NO. : 17/508818
DATED : February 13, 2024
INVENTOR(S) : Hai Li et al.

It is certified that error appears in the above-identified patent and that said Letters Patent is hereby corrected as shown below:

On the Title Page

Column 2, (57) ABSTRACT, Line 4: Delete "computing." and insert --computing-- therefor.

Signed and Sealed this
Second Day of July, 2024

Katherine Kelly Vidal
Director of the United States Patent and Trademark Office